(12) United States Patent
Penchuk

(10) Patent No.: US 7,145,819 B2
(45) Date of Patent: Dec. 5, 2006

(54) METHOD AND APPARATUS FOR INTEGRATED CIRCUIT WITH DRAM

(75) Inventor: Robert A. Penchuk, Wrentham, MA (US)

(73) Assignee: Analog Devices, Inc., Norwood, MA (US)

( * ) Notice: Subject to any disclaimer, the term of this patent is extended or adjusted under 35 U.S.C. 154(b) by 901 days.

(21) Appl. No.: 10/120,650

(22) Filed: Apr. 11, 2002

(65) Prior Publication Data

US 2002/0194425 A1    Dec. 19, 2002

Related U.S. Application Data

(60) Provisional application No. 60/297,421, filed on Jun. 11, 2001.

(51) Int. Cl.
*G11C 7/12* (2006.01)
(52) U.S. Cl. ..................... 365/203; 365/149
(58) Field of Classification Search ............... 365/149, 365/185.22, 203, 222
See application file for complete search history.

(56) References Cited

U.S. PATENT DOCUMENTS

| | | | |
|---|---|---|---|
| 4,458,336 A | | 7/1984 | Takemae |
| 4,791,616 A | * | 12/1988 | Taguchi et al. .............. 365/205 |
| 4,947,376 A | * | 8/1990 | Arimoto et al. ............. 365/205 |
| 4,956,819 A | * | 9/1990 | Hoffmann et al. ........... 365/201 |
| 5,058,073 A | * | 10/1991 | Cho et al. .................... 365/205 |
| 5,151,878 A | * | 9/1992 | Yamada et al. ......... 365/189.01 |
| 5,202,854 A | * | 4/1993 | Koike ......................... 365/203 |
| 5,546,346 A | | 8/1996 | Agata et al. |
| 5,870,343 A | * | 2/1999 | Chi et al. .................... 365/203 |
| 6,097,649 A | | 8/2000 | Chiang et al. |
| 6,111,802 A | | 8/2000 | Kano et al. |
| 6,301,175 B1 | * | 10/2001 | Seyyedy et al. ............ 365/203 |

FOREIGN PATENT DOCUMENTS

JP          55147771          5/1982

OTHER PUBLICATIONS

Yoon, Chi-Weon, "A 80/20MHz 160mW Multimedia Processor Integrated with Embedded DRAM MPEG-4 Accelerator and 3D Rendering Engine for Mobile Applications", ISSCC, Feb. 6, 2001, pp. 142-143, 441.
J. Barth et al., "A 300 Mhz Multi-Banked, eDRAM macro featuring GND Sense, Bit-Line Twisting and Direct Reference Cell Write", IBM MicroElectronics, ISSCC Submission #531, Paper 9.3, Oct. 30, 2001, 10 pages.

* cited by examiner

*Primary Examiner*—Tan T. Nguyen
(74) *Attorney, Agent, or Firm*—Wolf, Greenfield & Sacks, P.C.

(57) ABSTRACT

Various aspects of an integrated circuit having a DRAM are disclosed. In one embodiment an integrated circuit includes a DRAM that (1) pre-charges the bit lines to a voltage that is biased toward a weaker one of two memory cell logic states, (2) selectively stores data in an inverted form that reduces the power needed to refresh such data (in at least one embodiment), (3) retains data in the sense/latch circuits and use such circuits as a form of cache to reduce the frequency that memory cells are accessed and thereby reduce memory access time, and (4) supplies a reference (e.g., $V_{PP}$) from a circuit that employs an alternate, lower power, operating mode (e.g., if the DRAM is in standby).

27 Claims, 14 Drawing Sheets ized signal. Unchecked, these effects would, over time, cause drifts so large that the logic state of the signal is lost, i.e., the signal changes from a level that represents a first logic state to a level that represents a second logic state.

METHOD AND APPARATUS FOR INTEGRATED CIRCUIT WITH DRAM

PRIORITY CLAIM

This application claims priority under 35 U.S.C. §119(e) of Provisional Application No. 60/297,421, filed on Jun. 11, 2001, entitled "Write-back Efficiency for High Speed Embedded D-RAMs".

FIELD OF THE INVENTION

The present invention relates to integrated circuits having dynamic random access memory (DRAM).

BACKGROUND OF THE INVENTION

Many electronic devices employ digital memories, of which there are various types. Static random access memory (SRAM) is one type. In an SRAM, the memory cells employ active devices that are designed to be continuously powered and retain their logic state as long as the static RAM is powered. Another type is referred to as dynamic random access memory (DRAM).

In a DRAM, the signal in each memory cell must be occasionally restored (referred to herein as "refreshed"), so as not to lose the logic state. This is because various factors can cause the stored signal to drift. For example, active devices (e.g., MOSFETs) are typically used to access the memory cells in a DRAM. Leakage currents due to various parasitics associated with these devices, and/or from various other sources, can cause a stored signal to degrade over time. The direction of the change depends on the direction of the leakage currents, which depends in large part on the type of active devices that are used to access the memory cells. If N-channel MOSFETs are used to access the memory cells, then the direction of the leakage current is usually to $V_{SS}$. If P-channel MOSFETs are used, then the direction of the leakage current is to $V_{DD}$. Unchecked, these effects would, over time, cause drifts so large that the logic state of the signal is lost, i.e., the signal changes from a level that represents a first logic state to a level that represents a second logic state.

FIG. 1 shows an example of the drift and the refresh that occurs in a DRAM that uses N-channel MOSFETs to access the memory cells. A signal for a memory cell at a high logic state and a signal for a memory cell at a low logic state are shown. In this DRAM memory cells at a high logic state are refreshed to 0.8 $V_{DD}$. The memory cells at a low logic state are refreshed to 0.2 $V_{DD}$. In can be seen that both signals decrease over time. The decrease does not create a problem in regard to the signal representing a low logic state, because the decrease causes the voltage to get closer to zero, i.e., closer to the ideal voltage for a low logic state. The decrease however can create a problem for the signal intended to represent a high logic state. This is because over time and without a refresh, the voltage would eventually reach the low voltage state. Because the low logic state becomes "stronger" over time (i.e., the voltage gets closer to the ideal voltage for the low logic state) it is referred to herein as the "stronger" logic state. Because the high logic state becomes "weaker" over time (i.e., the voltage gets further from the ideal voltage for the high logic state) it is thus referred to as the "weaker logic state".

Refresh is usually carried out by an operation referred to as a read and write-back operation. Note that a pair of data lines (often referred to as bit lines, or BL and NOT BL) are typically used to read from and/or write to a memory cell. One of the bit lines is used to connect to the memory cell through an access device. The other bit line is used as a reference signal.

FIG. 2 shows the signal timing commonly used for a read and write-back operation. The operation has three phases: (1) a pre-charge phase (typically carried out while the address is being decoded), (2) a charge sharing phase in which the memory cell is connected to, and shares charge with, one of the bit lines, and (3) a latch phase in which the logic state of the memory cell is sensed (i.e., detected), latched, and written back into the memory cell. The three phases are further discussed below.

First note however, that the bit line BL is shown starting the pre-charge phase with a voltage near $V_{DD}$, and the bit line NOT BL is shown starting the pre-charge phase with a voltage near zero volts. This assumes that the previous read and write-back operation resulted in a high logic state on BL and a low logic state on NOT BL. It should be recognized that this will not always be the case. In some instances, the previous read and write-back operation results in a low logic state on BL and a high logic state on NOT BL. In such instances, BL starts the pre-charge phase with a voltage near zero volts, and NOT BL starts the pre-charge phase with a voltage near $V_{DD}$. Note that the memory cell is shown starting with a voltage that is approximately 0.7$V_{DD}$, which corresponds to a high logic state.

In the pre-charge phase, each of the bit lines is pre-charged to a midrail voltage, i.e., ½ $V_{DD}$. This prepares the bit lines for reading the data from the memory cell. Pre-charging to ½ $V_{DD}$ eliminates the need for reference cells, which had been commonly used in earlier, NMOS DRAMS. Note that the voltage of the memory cell does not change during the pre-charge phase.

In the charge sharing phase, BL is connected to a memory cell. This causes the bit line BL to share charge with the memory cell, which causes the voltage on BL to change (shown as a small increase). The change is usually relatively small (e.g. 100 millivolts, because the capacitance of the bit line is usually much greater than the capacitance of the memory cell). The direction of the change depends on the logic state of the memory cell. The change is positive if the memory cell has a high logic state (as shown in FIG. 2). The change is negative if the memory cell has a low logic state (for example, a voltage in the range from 0.2 $V_{DD}$ to zero volts).

Once the charge sharing phase is complete, the logic state of the memory cell can be determined by comparing the voltage on the bit line BL to the voltage on the bit line NOT BL. If the voltage of the bit line BL is greater than the voltage of the bit line NOT BL, then the memory cell is at a high logic state. If the voltage of the bit line BL is less than the voltage of the bit line NOT BL, then the memory cell is at a low logic state.

In this instance the voltage on the bit line BL is greater than the voltage on the bit line NOT BL, signifying that the memory cell had been at a high logic state. If the memory cell had been at a low logic state, then voltage of the memory cell would have been less than the voltage of the reference cell, and the decrease on BL would have been greater than the decrease on NOT BL.

The latch phase is used to sense and latch the logic state of the memory cell (based on the voltages on the bit lines BL, NOT BL) and to restore the signal in the memory cell. In the latch phase, BL remains operatively connected to the memory cell. The bit line with the higher of the two voltages, which in this instance is BL, is driven high (e.g., toward $V_{DD}$). The bit line with the lesser of the two voltages, which in this instance is NOT BL, is driven low (e.g., toward zero). At the end of the latch phase, the voltage on BL indicates the logic state of the memory cell. The signal in the memory cell is restored as the bit line BL is driven high (or low).

DRAMs have traditionally been provided in the form of dedicated integrated circuits (ICs). Such ICs are typically incorporated into an electronic device, along with one or more other ICs, such as for example, an IC for a digital information processor, an IC for an analog to digital converter, etc.

However, in order to reduce the size, speed, cost and/or power requirements of electronic devices, efforts have been made to bring DRAM memories (particularly high density digital DRAM memories) and other function(s) together onto a single IC. Digital memories that have been embedded onto an IC along with other function(s) are commonly referred to as "embedded" memories. There is now a desire to improve embedded DRAMs, for example to reduce the size, increase the density, increase the access speed, reduce the cost, increase the yield and reliability, and/or reduce the power requirements (for example in active mode and/or in standby mode).

Designers face various challenges with respect to achieving these objectives. Some of these challenges have to do with the need to refresh the memory cells. For example, memory cells must be refreshed even if the system and DRAM are in standby mode (e.g., where the DRAM is powered so as to retain the data, but is not accessible). Because the memory cells must be refreshed, the refresh circuitry continues to operate and draw power, even in standby mode. The impact on standby power may be significant, especially in the case where the electronic device has limited energy from which to draw on. This is particularly the case for small, battery powered electronic devices, e.g., hand held mobile phones. One reason for the high refresh power in standby mode is that many refresh circuits employ a charge pump. These charge pumps are customarily sized to handle the relatively high loads encountered in the active mode (i.e., normal operating mode), and therefore require as much power in standby mode as in the active mode.

In addition, memory cells are usually not accessible (to a processor) while the memory cells are being refreshed. This inaccessibility can stall a processor needing to access data in the memory cells. Note that the electrical time constant of the memory cells limits how quickly the signals can be refreshed. Also note that the electrical time constant often increases as DRAMs are made smaller and more dense. A stall rate that is as little as one percent can have a significant impact on system performance.

There are other challenges as well. For example, in order to reduce memory cycle time, it is common to shorten the duration of the write-back (latch) phase. However, this usually means that the latch phase does not last long enough for the voltage in the memory cell to reach $V_{DD}$. Recall that the electrical time limits how quickly the signal in the memory cell can be restored. For example, the latch phase may be made just long enough for the voltages on the bit lines to reach $0.8\ V_{DD}$ (rather than $V_{DD}$) for a high logic state and $0.2\ V_{DD}$ (rather than zero) for a low logic low state. The voltage often gets as low as $0.6\ V_{DD}$ prior to refresh.

The above technique of reducing the duration of the write-back phase can create difficulties for designers and manufacturers seeking to provide embedded DRAMs that are smaller, faster, more reliable, and/or require less power.

First, cell voltages between $0.8\ V_{DD}$ and $0.6\ V_{DD}$ provide less drive than voltages between $V_{DD}$ and $0.8\ V_{DD}$. Less drive makes it more difficult to tolerate higher cell time constants, therefore making it more difficult to reduce the size of the DRAM. In addition, less drive also makes it more difficult to reduce cell access time (i.e., increase the speed of the DRAM) and more difficult to increase bit line loading (another common technique to reduce the size of the DRAM). Moreover, because the cells have lower voltages, the cells have less immunity to soft errors and switching noise, and less tolerance for leakage current, thereby making it more difficult to increase yield.

Thus, notwithstanding the level of performance provided by current embedded DRAMs, there remains a desire for further enhancements, for example, to provide embedded DRAMs that are smaller (higher density), faster, more reliable, and/or require less power (in active mode and/or in standby mode).

SUMMARY OF THE INVENTION

In one embodiment of the present invention, an integrated circuit includes a DRAM that (1) pre-charges the bit lines to a voltage that is biased toward a weaker one of two memory cell logic states, (2) selectively stores data in an inverted form that reduces the power needed to refresh such data (in at least one embodiment), (3) retains data in the sense/latch circuits and use such circuits as a form of cache to reduce the frequency that memory cells are accessed and thereby reduce memory access time, and (4) supplies a reference (e.g., $V_{pp}$) from a circuit that employs an alternate, lower power, operating mode (e.g., if the DRAM is in standby).

Note however, that various aspects of the present invention are disclosed below. These various aspects are not limited to the embodiment described above. Moreover, although there may be potential advantages to one or more embodiments of one or more aspects of the present invention, it should be understood that there is no requirement that any embodiment of any aspect of the present invention provide such advantages. Also note that the various aspects of the present invention may be used alone or in combination with one or more of the other aspects. Further, these aspects may be employed in any type of DRAM, whether embedded or not.

It has been recognized that the latter mentioned aspect of the present invention is not limited to charge pumps but rather may be applied to bypass any dc—dc converter in the DRAM.

According to one aspect of the present invention, a dynamic random access memory (DRAM) includes a read mode having a pre-charge state and comprises: a memory space having a plurality of memory cells, at least a subset of the memory cells being capable of storing signals corresponding to a first logic state or a second logic state, wherein one of the logic states is weaker than the other logic state; a plurality of logic circuits, at least one of which includes CMOS logic; a plurality of bit lines for reading and writing data to the at least a subset of the memory cells; and a circuit to, in the pre-charge state, pre-charge at least one of the bit lines to a predetermined voltage biased toward the weaker logic state.

According to another aspect of the present invention, a dynamic random access memory (DRAM) includes a read mode having a pre-charge state and comprises: a memory space having a plurality of memory cells, at least a subset of the memory cells being capable of storing signals corresponding to a first logic state or a second logic state, wherein one of the logic states is weaker than the other logic state; a plurality of logic circuits, at least one of which includes CMOS logic; a plurality of bit lines for reading and writing data to the at least a subset of the memory cells; and means for pre-charging at least one of the bit lines to a predetermined voltage biased toward the weaker logic state in the pre-charge state.

According to another aspect of the present invention, a method for use in a CMOS DRAM having a memory space having a plurality of memory cells, at least a subset of the memory cells being capable of storing signals corresponding to a first logic state or a second logic state, wherein one of the logic states is weaker than the other logic state, and further having a plurality of bit lines for reading and writing data to the at least a subset of the memory cells, the CMOS DRAM including a read mode having a pre-charge state, the method comprising pre-charging at least one of the bit lines to a predetermined voltage biased toward the weaker logic state in the pre-charge state.

According to another aspect of the present invention, an integrated circuit comprises: a dynamic random access memory (DRAM) that receives input data and selectively stores the data in either an inverted form or a non-inverted form in response to an invert control signal.

According to another aspect of the present invention, an integrated circuit comprises: a dynamic random access memory (DRAM) that receives input data and includes means for selectively storing the data in either an inverted form or a non-inverted form based on the state of an invert control signal.

According to another aspect of the present invention, a method for use in a dynamic random access memory (DRAM), the method comprising: selectively storing the data in either an inverted form or a non-inverted form based on the state of an invert control signal.

According to another aspect of the present invention, An integrated circuit comprising: a dynamic random access memory (DRAM) comprising: a memory space having a plurality of memory cells, at least a subset of the memory cells being capable of storing signals corresponding to a first logic state or a second logic state; a plurality of pairs of bit lines, coupled to the at least a subset of the memory cells, for reading and writing data to the at least a subset of the memory cells; a plurality of sense/latch circuits, each circuit having first and second terminals; a plurality of switches to selectively couple each of the sense/latch circuits to a respective pair of bit lines, wherein the DRAM has at least one operating state in which at least a subset of the plurality of sense/latch circuits are coupled to and receive signals from the respective pair of bit lines, and at least one operating state in which at least one of the terminals of each of the at least a subset of the plurality of sense/latch circuits is coupled to and drives at least one of the respective pair of bit lines, and at least one operating state in which each of the at least a subset of the plurality of sense/latch circuits retains data indicating a logic state of a signal stored in a respective memory cell; and a cache management circuit that has signals that indicate addresses associated with memory cells for which data is currently retained in the plurality of sense/latch circuits, the cache management circuit further having an input to receive an address that indicates a request for data stored in memory cells associated with the received address, and further having an output to supply a signal that indicates whether the received address is one of the addresses associated with memory cells for which data is currently retained in the plurality of sense/latch circuits.

According to another aspect of the present invention, an integrated circuit comprising: a dynamic random access memory (DRAM) comprising: a memory space having a plurality of memory cells, at least a subset of the memory cells being capable of storing signals corresponding to a first logic state or a second logic state; a plurality of pairs of bit lines, coupled to the at least a subset of the memory cells, for reading and writing data to the at least a subset of the memory cells; a plurality of sense/latch circuits, each circuit having first and second terminals; a plurality of switches to selectively couple each of the sense/latch circuits to a respective pair of bit lines, wherein the DRAM has at least one operating state in which at least a subset of the plurality of sense/latch circuits are coupled to and receive signals from the respective pair of bit lines, and at least one operating state in which at least one of the terminals of each of the at least a subset of the plurality of sense/latch circuits is coupled to and drives at least one of the respective pair of bit lines, and at least one operating state in which each of the at least a subset of the plurality of sense/latch circuits retains data indicating a logic state of a signal stored in a respective memory cell; and cache management means for storing signals that indicate addresses associated with memory cells for which data is currently retained in the plurality of sense/latch circuits, for receiving an address that indicates a request for data stored in memory cells associated with the received address, and for supplying a signal that indicates whether the received address is one of the addresses associated with memory cells for which data is currently retained in the plurality of sense/latch circuits.

According to another aspect of the present invention, a method for use in a dynamic random access memory (DRAM) having a memory space having a plurality of memory cells, at least a subset of the memory cells being capable of storing signals corresponding to a first logic state or a second logic state, the DRAM further having a plurality of pairs of bit lines, coupled to the at least a subset of the memory cells, for reading and writing data to the at least a subset of the memory cells, and a plurality of sense/latch circuits, each sense/latch circuit having first and second terminals, the method comprising: providing at least one operating state in which at least a subset of the plurality of sense/latch circuits are coupled to and receive signals from the respective pair of bit lines; providing at least one operating state in which at least one of the terminals of each of the at least a subset of the plurality of sense/latch circuits is coupled to and drives at least one of the respective pair of bit lines; providing at least one operating state in which each of the at least a subset of the plurality of sense/latch circuits retains data indicating a logic state of a signal stored in a respective memory cell; storing signals that indicate addresses associated with memory cells for which data is currently retained in the plurality of sense/latch circuits; receiving an address that indicates a request for data stored in memory cells associated with the received address; and supplying a signal that indicates whether the received address is one of the addresses associated with memory cells for which data is currently retained in the plurality of sense/latch circuits.

According to another aspect of the present invention, an integrated circuit comprising: a dynamic random access memory (DRAM) comprising: a memory space having a plurality of memory cells, at least a subset of the memory cells being capable of storing signals corresponding to a first logic state or a second logic state; a plurality of pairs of bit lines, coupled to the at least a subset of the memory cells, for reading and writing data to the at least a subset of the memory cells; a plurality of sense/latch circuits, each circuit having first and second terminals; a plurality of switches to selectively couple each of the sense/latch circuits to a respective pair of bit lines; the DRAM having at least a first operating state in which at least a subset of the plurality of sense/latch circuits receive signals from the respective pair of bit lines, the signals indicating a logic state of a signal stored in a respective memory cell, and further having at least a second operating state in which at least one of the terminals of each of the at least a subset of the plurality of sense/latch circuits provides a signal to drive at least one of the respective pair of bit lines, and further having at least a third operating state in which at least one of the terminals of each of the at least a subset of the plurality of sense/latch circuits is not connected to the respective pair of bit lines and supplies a signal that indicates the logic state of the signal stored in the respective memory cell at least partially concurrently with the respective pair of bit lines for each of the at least a subset of the plurality of sense/latch circuits being coupled to a pre-charge signal.

According to another aspect of the present invention, an integrated circuit comprising: a dynamic random access memory (DRAM) comprising: a memory space having a plurality of memory cells, at least a subset of the memory cells being capable of storing signals corresponding to a first logic state or a second logic state; a plurality of pairs of bit lines, coupled to the at least a subset of the memory cells, for reading and writing data to the at least a subset of the memory cells; a plurality of sense/latch circuits, each circuit having first and second terminals; a plurality of switches to selectively couple each of the sense/latch circuits to a respective pair of bit lines; the DRAM having at least a first operating state in which at least a subset of the plurality of sense/latch circuits receive signals from the respective pair of bit lines, the signals indicating a logic state of a signal stored in a respective memory cell, and further having at least a second operating state in which at least one of the terminals of each of the at least a subset of the plurality of sense/latch circuits provides a signal to drive at least one of the respective pair of bit lines, and further having at least a third operating state in which at least one of the terminals of each of the at least a subset of the plurality of sense/latch circuits is not connected to the respective pair of bit lines and supplies a signal that indicates the logic state of the signal stored in the respective memory cell; and means for pre-charging the respective pair of bit lines for each of the at least a subset of the plurality of sense/latch circuits at least partially concurrently with the third operating state.

According to another aspect of the present invention, a method for use in a dynamic random access memory (DRAM) having a memory space having a plurality of memory cells, at least a subset of the memory cells being capable of storing signals corresponding to a first logic state or a second logic state, the DRAM further having a plurality of pairs of bit lines, coupled to the at least a subset of the memory cells, for reading and writing data to the at least a subset of the memory cells, and a plurality of sense/latch circuits, each sense/latch circuit having first and second terminals, the method comprising: providing at least a first operating state in which at least a subset of the plurality of sense/latch circuits receive signals from the respective pair of bit lines, the signals indicating a logic state of a signal stored in a respective memory cell; providing at least a second operating state in which at least one of the terminals of each of the at least a subset of the plurality of sense/latch circuits provides a signal to drive at least one of the respective pair of bit lines; providing at least a third operating state in which at least one of the terminals of each of the at least a subset of the plurality of sense/latch circuits is not connected to the respective pair of bit lines and supplies a signal that indicates the logic state of the signal stored in the respective memory cell; and providing at least one operating state in which the respective pair of bit lines for each of the at least a subset of the plurality of sense/latch circuits are pre-charged at least partially concurrently with the third operating state.

According to another aspect of the present invention, an integrated circuit comprising: a dynamic random access memory (DRAM) comprising: a memory space having a plurality of memory cells, at least a subset of the memory cells being capable of storing signals corresponding to a first logic state or a second logic state; a plurality of pairs of bit lines, coupled to the at least a subset of the memory cells, for reading and writing data to the at least a subset of the memory cells; a plurality of sense/latch circuits, each circuit having first and second terminals; a plurality of switches to selectively couple each of the sense/latch circuits to a respective pair of bit lines, wherein the DRAM has a first read mode in which the DRAM receives an address that indicates a request for data stored in memory cells associated with the address, and in response, the first and the second terminals of each of at least a subset of the sense/latch circuits are coupled to and receive signals from the respective pair of bit lines, the signals indicating a logic state stored in a respective memory cell, the DRAM has a write-back mode in which at least one of the terminals of each of the at least a subset of the plurality of sense/latch circuits is coupled to and drives at least one of the respective pair of bit lines to provide a signal to write-back to the respective memory cell, and the DRAM has a second read mode in which the DRAM receives an address that indicates a request for data stored in memory cells associated with the address received in the second read mode, at least one of said terminals of the at least a subset of the plurality of sense/latch circuits supplies one or more signals that indicate the logic state of data stored in the memory cells associated with the address received in the second read mode, without coupling said terminals of the plurality of sense/latch circuits to the respective pair of bit lines in response to the address received in the second read mode.

According to another aspect of the present invention a DRAM has at least two operating modes including a first operating mode and a second operating mode, the DRAM comprising: a dc—dc converter circuit that has a first input to receive an input voltage and has an output to provide an output voltage; a switch network having a first input terminal connected to the output of the dc—dc converter terminal, having a second input terminal to receive an input voltage, having a control terminal to receive a signal that indicates whether the DRAM is in the first operating mode or in the second operating mode, and having an output terminal to provide an output voltage, wherein if the DRAM is in the first operating mode then the switch network connects the output terminal to the first input terminal, and if the DRAM is in the second operating mode then the switch network connects the output terminal to the second input terminal; and at least one circuit having a terminal connected to the output of the switch network.

DETAILED DESCRIPTION

Figure 1:
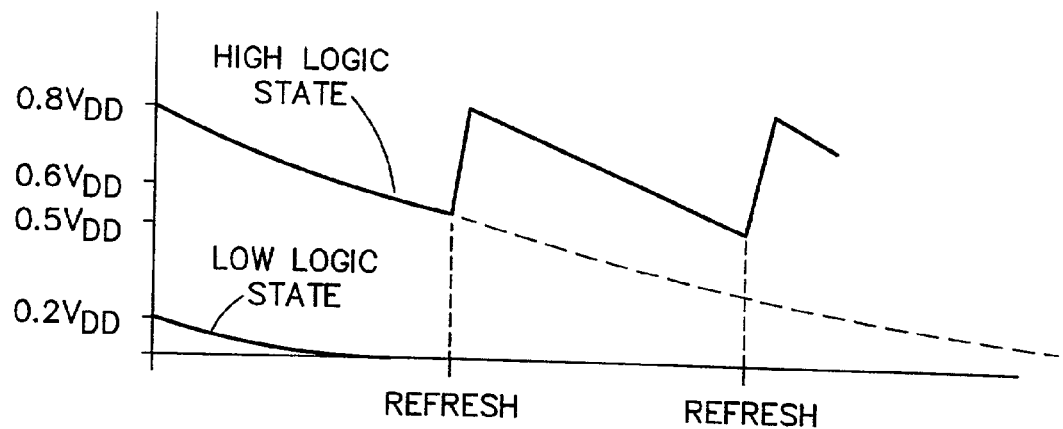
FIG. 1 shows the effects of leakage on signals used to represent high logic states and low logic states in a prior art DRAM.
Figure 2:
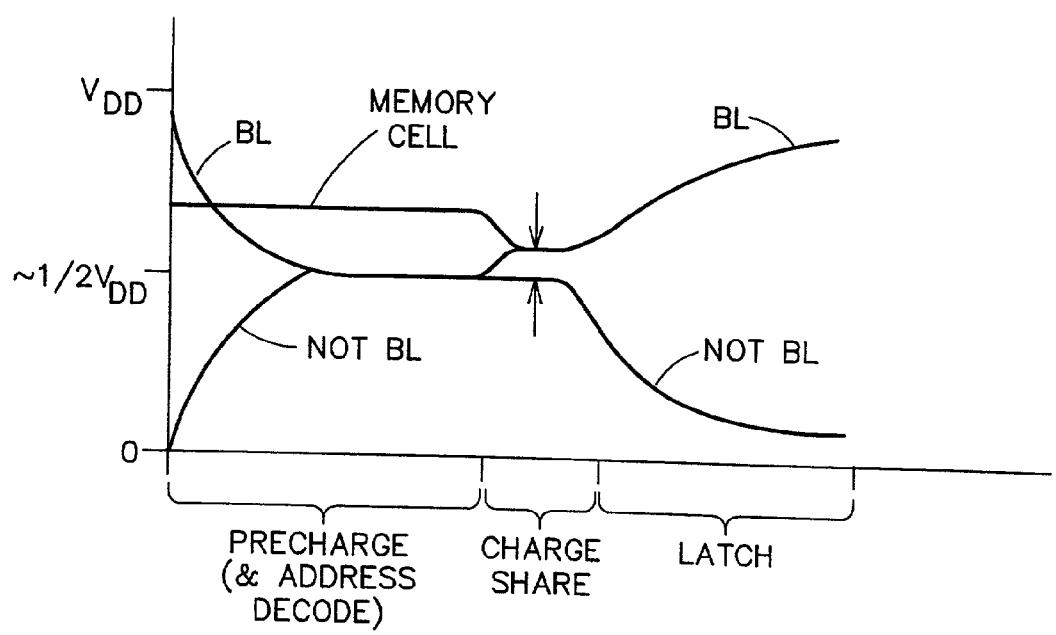
FIG. 2 shows signal timing used for read and write-back operations in a prior art DRAM.
Figure 3:
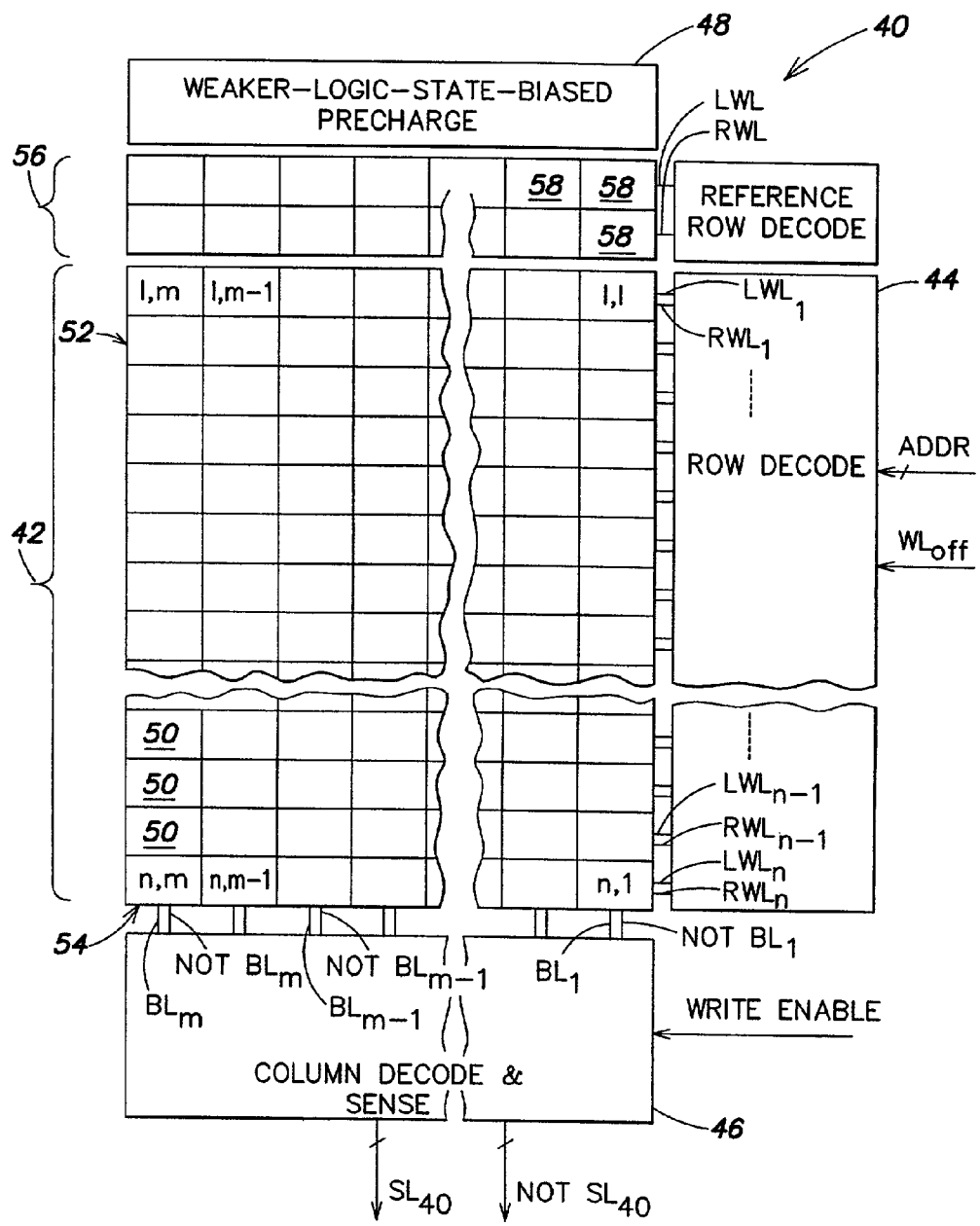
FIG. 3 is a representation of a DRAM circuit according to one embodiment of one aspect of the present invention.

FIG. 3 shows a representation of a DRAM circuit 40 according to one embodiment of one aspect of the present invention. The DRAM circuit 40 may, for example, be a CMOS type of DRAM circuit, meaning that one or more circuits of the DRAM circuit 40 is implemented in "Complementary Metal Oxide Semiconductor" technology. The DRAM may be used to store any type of data. As used herein, the term "data" is meant to include all types of information, for example but not limited to, numeric data, alphanumeric data, signal data (for example, but not limited to, audio data or video data) image data, program or object code, or any combination thereof.

The DRAM circuit 40 comprises a memory array 42, a row decode circuit 44, and a column decode and sense circuit 46. The memory array 42 has a group of memory macro cells shown schematically as boxes, for example, as indicated at 50. In this embodiment, each of the macro cells has two memory cells, i.e., a left memory cell and a right memory cell (refer to FIG. 6 for a detail), although the present invention is not limited to such. The macro cells are formed into groups of horizontal rows, for example as indicated at 52, and vertical columns, for example as indicated at 54. In one exemplary embodiment, there are 128 rows and 128 columns of macro cells.

Figure 6:
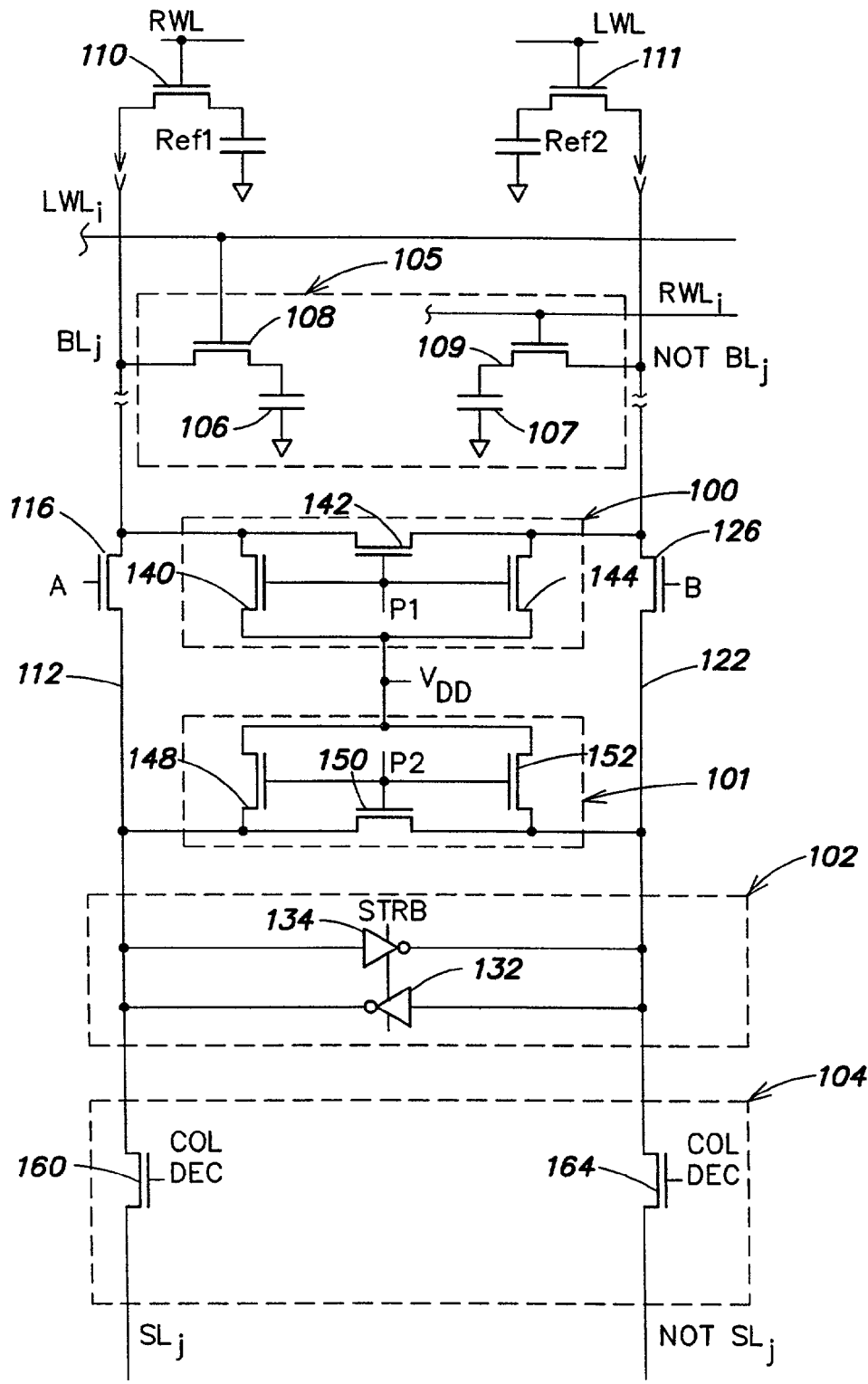
FIG. 6 is a schematic diagram of a portion of one embodiment of the DRAM circuit of FIG. 3.

The macro cells are accessed one row at a time by asserting one of the word lines $RWL_1$–$RWL_n$, $LWL_1$–$LWL_n$, which run horizontally through the memory array 42 (refer to FIG. 6 for a detail). For example, a word line $RWL_i$ is asserted to access the right memory cell of each macro cell in an associated row$_i$. A word line $LWL_i$ is asserted to access the left memory cell of each macro cell in the row$_i$. The row decode circuit 44 decodes an ADDR signal to determine which of the word lines $RWL_1$–$RWL_n$, $LWL_1$–$LWL_n$, to assert.

Data is passed into and out of the memory cells via pairs of complementary signal lines, referred to as bit lines, $BL_1$–$BL_m$, NOT $BL_1$–NOT $BL_m$, which run vertically through the memory array 42. A distinct pair of bit lines $BL_i$, NOT $BL_i$, is provided to each column of macro cells (refer to FIG. 6 for a detail). Note that in the case where complementary outputs are provided, and only one complement in an asserted state may be discussed, it should be clear to those skilled in the art that an unasserted complement is also implied.

Each pair of bit lines $BL_i$, NOT $BL_i$, couples to an associated sense/latch circuit in the column decode and sense circuit 46 (refer to FIG. 6 for a detail). Note that a sense/latch circuit is sometimes referred to as sense amplifier circuit, wherein the term "amplifier" is meant to include a circuit or circuits that perform a non-linear switching function. The column decode and sense circuit 46 selects the outputs of certain sense/latch circuits in accordance with the ADDR signal. The selected outputs are provided at $SL_{40}$, NOT $SL_{40}$.

The DRAM circuit 40 further includes two reference rows, indicated at 56. Each of the reference rows has a plurality of reference cells shown schematically as boxes 58. The reference cells 58 are used to provide reference signals for use in reading data from the memory cells, as further described below. One row of reference cells is used when accessing the left memory cell in the macro cells 50. The other row of reference cells is used when accessing the right memory cell in the macro cell 50. In this embodiment, the reference cells 58 are identical to the memory cells in the memory array 42, although this is not required.

As stated previously, memory cells in a DRAM must be occasionally refreshed so as not to lose their logic state. The refresh is commonly carried out using a read and write-back operation, the first phase of which pre-charges the bit lines. As such, the DRAM circuit 40 includes pre-charge circuitry 48. However, unlike prior art CMOS DRAMs, the pre-charge circuitry 48 does not pre-charge the bit lines to ½ $V_{DD}$, but rather pre-charges the bit lines to a voltage that is biased toward the weaker memory cell logic state. For example if the high logic state is the weaker logic state, then the bit lines are pre-charged to $V_{DD}$.

This has various advantages. For example, if the bit lines are pre-charged to $V_{DD}$ instead of ½ $V_{DD}$, higher voltages are able to be stored in the memory cells, without extending the latch (write-back) phase. A higher voltage provides higher drive, which may make it possible to tolerate higher cell time constants, which as previously discussed, may make it possible to reduce the size of the DRAM. In addition, the higher drive capability may make it possible to reduce cell access time (i.e., increase the speed of the DRAM) and make it possible to increase bit line loading (another common technique to reduce the size of the DRAM). Moreover, because of the higher voltage, the cells may have greater immunity to soft errors and to switching noise from logic. Furthermore, higher cell voltages may also result in greater tolerance for leakage current, thereby increasing yield and/or expanding memory temperature range. Higher cell voltages may also make it possible to reduce the rate at which refresh is carried out. In addition, greater margins enable the use of lower $V_{DD}$ voltages, which tends to lower power requirements. In addition, pre-charging to $V_{DD}$ rather than ½ $V_{DD}$ may make it possible to eliminate a high power charge pump normally used to pre-charge to ½ $V_{DD}$, which may significantly reduce the power requirements in standby mode. In addition, the higher pre-charge voltage may help reduce the parasitic junction capacitance on the bit line.

Note that, if the weaker logic state is the low logic state, then the bit lines may, for example, be pre-charged to $V_{SS}$, thereby producing a lower voltage (for a low logic state) in the memory cell, without extending the write-back phase. In this case (i.e., the weaker logic state is a low logic state), the pre-charge circuitry may include a pull-down transistor coupled between the bit lines and a supply voltage.

Figures 4, 5:
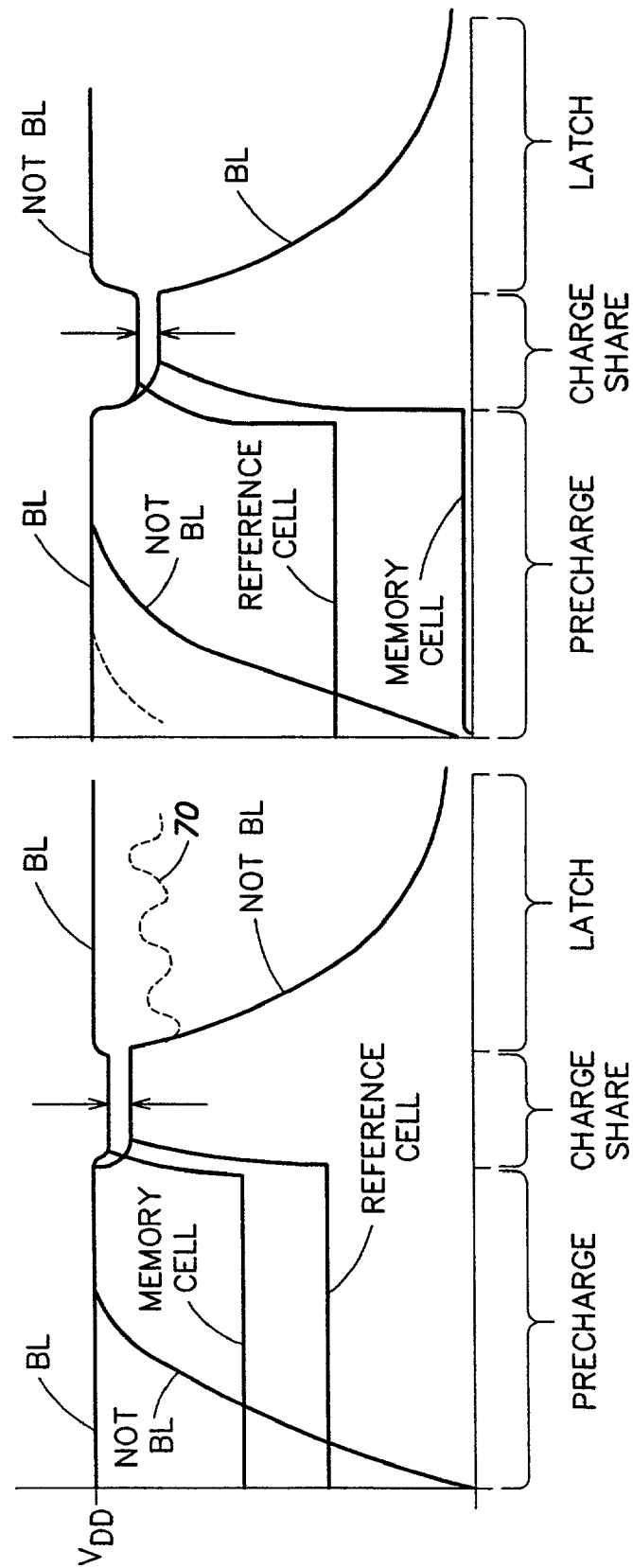
FIG. 4 shows signal timing used for read and write-back operations in one embodiment of the DRAM circuit of FIG. 3.
FIG. 5 shows signal timing used for read and write-back operations in one embodiment of the DRAM circuit of FIG. 3.

FIGS. 4, 5 show a signal timing used for read and write-back operations with a weaker-logic-state-biased pre-charge in one embodiment. Specifically, FIG. 4 shows the signal timing if reading a memory cell that has a voltage corresponding to a high logic state. FIG. 5 shows the signal timing if reading a memory cell that has a voltage corresponding to a low logic state. Note that in this embodiment, the high logic state is the weaker memory cell logic state. Also note that reference cell signals are shown in FIGS. 4, 5. The reference cells are used in reading the logic state of the memory cell. The reference cells are employed in this embodiment because the bit lines are pre-charged to $V_{DD}$ rather than ½ $V_{DD}$.

Referring to FIG. 4, there are three phases to the read and write-back operation: a pre-charge phase: a charge sharing phase, and latch phase. Note that the voltage of the memory cell is shown starting the pre-charge phase at approximately $0.7V_{DD}$, which is within the range for a high logic state. The voltage of the reference cell (used in reading the logic state of the memory cell) is shown starting at approximately $0.4V_{DD}$, i.e., approximately midway between the range for the high logic state and the range for the low logic state.

Also note that the bit line BL is shown starting the pre-charge phase with a voltage near $V_{DD}$, and that the bit line NOT BL is shown starting the pre-charge phase with a voltage near zero volts. This assumes that the previous read and write-back operation resulted in a high logic state on BL and a low logic state on NOT BL. It should be recognized that this will not always be the case. In some instances, the previous read and write-back operation results in a low logic state on BL and a high logic state on NOT BL. In such instances, BL starts the pre-charge phase with a voltage near zero volts, and NOT BL starts the pre-charge phase with a voltage near $V_{DD}$.

In the pre-charge phase, the bit lines BL, NOT BL, are each pre-charged to $V_{DD}$. Note that the voltage of the memory cell and the voltage of the reference cell do not change during the pre-charge phase.

In the charge sharing phase, the bit line BL is connected to the memory cell. This causes the bit line BL to share charge with the memory cell, which causes the voltage on BL to decrease somewhat. The magnitude of the decrease depends on the voltage in the memory cell (i.e., the logic state of the memory cell). The higher the voltage of the memory cell, the lesser the decrease.

The bit line NOT BL is connected to the reference cell. This causes the bit line BL to share charge with the reference cell. The voltage of the reference cell will always be less than $V_{DD}$, and therefore, charge sharing causes the voltage on NOT BL to decrease.

Once the charge sharing phase is complete, the logic state of the memory cell can be determined by comparing the voltage on the bit line BL to the voltage on the bit line NOT BL. If the voltage of the bit line BL is greater than the voltage of the bit line NOT BL, then the memory cell is at a high logic state. On the other hand, if the voltage of the bit line BL is less than the voltage of the bit line NOT BL, then the memory cell is at a low logic state.

In this instance the voltage on the bit line BL is greater than the voltage on the bit line NOT BL. This is because memory cell had been at a high logic state. If the memory cell had been at a low logic state, then voltage of the memory cell would have been less than the voltage of the reference cell, and the decrease on BL would have been greater than the decrease on NOT BL.

The latch phase is used to sense and latch the logic state of the memory cell (based on the voltages on the bit lines BL, NOT BL), and to restore the signal in the memory cell. In the latch phase, the bit line with the higher of the two voltages, which in this instance is BL, is driven high (e.g., toward $V_{DD}$). The bit line with the lesser of the two voltages, which in this instance is NOT BL, is driven low (e.g., toward zero). At the end of the latch phase, the voltage on BL indicates the logic state of the memory cell. The signal in the memory cell is restored as the bit line BL is driven high (or low).

FIG. 5 shows the signal timing if reading a memory cell that has a voltage corresponding to a low logic state. Note that the voltage of the memory cell is shown starting at approximately zero volts, which is in the range for a low logic state. As in FIG. 4, the voltage of the reference cell again starts at approximately $0.4V_{DD}$, i.e., approximately midway between the range for the high logic state and the range for the low logic state.

The signal timing of FIG. 5 is similar to that of FIG. 4 except that because the memory cell is at a low logic state, the voltage of the memory cell is less than that of the reference cell, and consequently, charge sharing causes the decrease on BL to be greater than the decrease on NOT BL. In the latch phase, NOT BL is the bit line with the higher of the two voltages, and is therefore driven high. The bit line BL has the lesser of the two voltages, and is therefore driven low. As in FIG. 4, the voltage on BL indicates the logic state of the data in the memory cell. The signal in the memory cell is restored as the bit line BL is driven low.

It should be recognized that this aspect of the present invention is not limited to pre-charging to $V_{DD}$ or $V_{SS}$. For example, various degrees of benefit may be obtained by pre-charging to any voltage that is biased toward the weaker logic state, i.e., any voltage greater than $(V_{DD}-V_{SS})/2$ if the weaker logic state is the high logic state, and any voltage less than $(V_{DD}-V_{SS})/2$ if the weaker logic state is the low logic state. Thus, in some embodiments, a biased pre-charge is achieved without pre-charging to $V_{DD}$ or $V_{SS}$.

For example, some embodiments may pre-charge to a voltage of $V_{DD}-V_{TH}$ by using a N channel FET. Note that the threshold voltage $V_{TH}$ will typically depend on the technology and the supply voltage. For 0.13 um CMOS with a one volt supply, the threshold voltage is approximately 0.2V. For 0.18 um CMOS operated with a 1.8 volt supply, the threshold voltage is approximately 0.6 volts.

Note that the high logic state is usually the weaker logic state if N-channel MOSFET transistors are used to access the memory cells. The low logic state is usually the weaker logic state if P-channel MOSFET transistors are used to access the memory cells).

Now that weaker-logic-state-biased pre-charge has been discussed, potential modifications to the signal timing shown in FIGS. 4, 5 are discussed. Note that an example of a circuit that may be used to pre-charge to $V_{DD}$, is shown and described hereinafter with respect to FIGS. 6, 7.

Referring again to FIGS. 4, 5, it should be recognized that for the timing discussed above, the voltage swings that occur when refreshing a memory cell at a high logic state are approximately equal to the voltage swings that occur when refreshing a memory cell at a low logic state. As a result, for the timing discussed above, the amount of power needed to refresh a memory cell at a high logic state (FIG. 4) is approximately equal to the amount of power needed to refresh a memory cell at a low logic state (FIG. 5).

It should also be recognized however, that in the timing of FIG. 4, there is no need to drive the bit line NOT BL down to zero volts. Consequently, some embodiments terminate the drive to the bit line NOT BL before the end of the latch phase. This is referred to herein as "write-back termination". The dashed line 70 shows the voltage that occurs on the bit line NOT BL if write-back termination is used. It should be apparent that write-back termination significantly reduces the voltage swing on NOT BL, and thereby reduces the power required to refresh a memory cell having a high logic state.

However, terminating the drive on NOT BL does not produce comparable benefits for the signal timing of FIG. 5. This is because the voltage swing of NOT BL in FIG. 5 is relatively small compared to the voltage swing of NOT BL (without write-back termination) in FIG. 4. Note that write-back termination is not usually employed for the bit line, BL, because it is desirable to drive the bit line BL toward zero in order to be sure to restore the voltage in the memory cell.

Consequently, if write-back termination is employed, the amount of power needed to refresh a memory cell at a high logic state (e.g., as in FIG. 4) is less than the amount of power needed to refresh a memory cell at a low logic state (e.g., as in FIG. 5. This means that the amount of power required to refresh data that is made up mostly of 1's is less than the amount of power that is made up mostly of 0's, all else being equal. It has been determined however, that data made up mostly of 0's can be stored in an inverted form, to help reduce the amount of refresh power needed to retain such data. A circuit to invert data in accordance with one embodiment of one aspect of the present invention is described below with reference to FIGS. 11, 12A–12B, 13A–13B.

FIG. 6 shows an example of a circuit that may be used to perform refresh, with write-back termination, for a column of macro cells. The circuit includes a pair of bit lines, indicated at $BL_j$ and NOT $BL_j$, pre-charge circuits 100, 101, a sense/latch circuit 102, and a decode circuit 104. A macro cell is represented at 105. The macro cell 105 has a right memory cell (represented for example as a capacitance) shown at 106 and a left memory cell (represented for example as a capacitance) shown at 107.

A number of transistors are shown in FIG. 6. Each of the transistors is an N-channel MOSFET, unless stated otherwise. A transistor 108, which receives a control signal, $LWL_i$, is used to couple/decouple the left memory cell 106 to the bit line $BL_j$. A transistor 109, which receives a word line $RWL_i$, is used to couple/decouple the left memory cell 107 to the other bit line, NOT $BL_j$. Note that only one of the memory cells 106, 107 is accessed at a time. A first reference cell (represented for example as a capacitance) is indicated by REF1. A second reference cell (represented for example as a capacitance) is indicated by REF2. A transistor 110, which receives a control signal, RWL, is used to couple/decouple the first reference cell REF1 to the bit line $BL_j$. A transistor 111, which receives a word line LWL, is used to couple/decouple the second reference cell REF2 to the other bit line, NOT $BL_j$.

The reference cells REF1, REF2 are used to provide reference signals for use in reading data from the memory cells. The first reference cell REF1 is used if the right memory cell 107 is accessed. The second reference cell REF2 is used if the left memory cell 106 is accessed. The reference cells REF1, REF2 are typically pre-charged (by reference cell pre-charge circuitry, not shown) to a signal that is approximately midway between a signal associated with a high logic state and a signal associated with a low logic state.

One terminal on the sense/latch circuit 102 is selectively coupled to the bit line $BL_j$ by way of a signal line 112 and a switch 116 (which responds to a control signal A). The other terminal on the sense/latch circuit 102 is selectively coupled to the bit line NOT $BL_j$ by way of a signal line 122 and a switch 126 (which responds to a control signal B). Note that the switches 116, 126 are shown as a FET, however, other types of switches may also be used. The first pre-charge circuit 100 (which responds to a control signal P1) is used to pre-charge the bit lines $BL_j$, NOT $BL_j$. The second pre-charge circuit 101 (which responds to a control signal P2) is used to pre-charge the signal lines 112, 122. The decode circuit 104 receives signals from the sense/latch circuit 102 and responds to a control signal (indicated at COL DEC) to supply output signals, $SL_j$, NOT $SL_j$.

In this embodiment, the sense/latch circuit 102 comprises two cross coupled inverter buffers 132, 134. A control signal, indicated at STRB, is supplied to an enable pin on each of the buffers 132, 134 and is used to enable/disable the sense/latch circuit 102. In this embodiment, each of the buffers 132, 134 is a CMOS device.

The first pre-charge circuit 100 is made up of three transistors 140, 142, 144. The P1 signal is supplied to the gate terminal of each of the transistors 140, 142, 144. The drain terminals of transistors 140, 144 are connected to a pre-charge voltage (e.g., $V_{DD}$). If the P1 signal is asserted, the transistors 140, 144 turn on and supply the pre-charge voltage (e.g., $V_{DD}$) to each of the bit lines $BL_j$, NOT $BL_j$. The second pre-charge circuit 101 is made up of transistors 148, 150, 152. The P2 signal is supplied to the gate terminal of each of the transistors 148, 150, 152. The drain terminals of transistors 148, 152 are connected to the pre-charge voltage (e.g., $V_{DD}$). If the P2 signal is asserted, the transistors 148, 152 turn on and supply the pre-charge voltage (e.g., $V_{DD}$) to the signal lines 112, 122.

The decode circuit 104 includes transistors 160, 162. The COL DEC signal is supplied to a gate terminal of each of transistors 160, 164. A drain terminal of each transistor 160, 164 is supplied with a respective signal from the sense/latch circuit 102. If the COL DEC signal is asserted, the transistors 160, 164 turn on and supply the signals from the sense/latch circuit 102 to the signal lines $SL_j$, NOT $SL_j$. Although not shown, a third pre-charge circuit, similar to the first and second pre-charge circuits 100, 101, may be provided to pre-charge the signal lines $SL_j$, NOT $SL_j$, before the COL DEC signal is asserted.

In some embodiments, the word lines $LWL_i$, $RWL_i$ and the control signals P1, P2 are driven by a voltage, $V_{PP}$, that is greater than $V_{DD}$. This is so that the transistors driven by word lines $LWL_i$, $RWL_i$ and control signals P1, P2 (i.e., transistors 108–109, 140–142 and 148–152 are able to supply $V_{DD}$ without a threshold drop. A circuit for generating $V_{PP}$ in accordance with one embodiment of one aspect of the present invention is described below with reference to FIGS. 11, 15–16.

In some embodiments, the sense/latch circuits are used as a form of register (or cache) to reduce the memory access time. In such embodiments, the sense/latch circuits have a register state in which they retain data retrieved from the memory cells. Before data is further retrieved from the memory array, a determination is made as to whether the data is already retained in the sense/latch circuits. If the data is so retained, then the data is retrieved from the sense/latch circuits. This avoids the need to access the memory array. The sense/latch circuits may be decoupled from the bit lines while retaining data in this register state, so as not to interfere with the bit lines being pre-charged in preparation for a future memory cell access. A circuit for managing the caching of the sense/latch circuits in accordance with one embodiment of one aspect of the present invention is described below with reference to FIGS. 11, 14.

Figure 7:
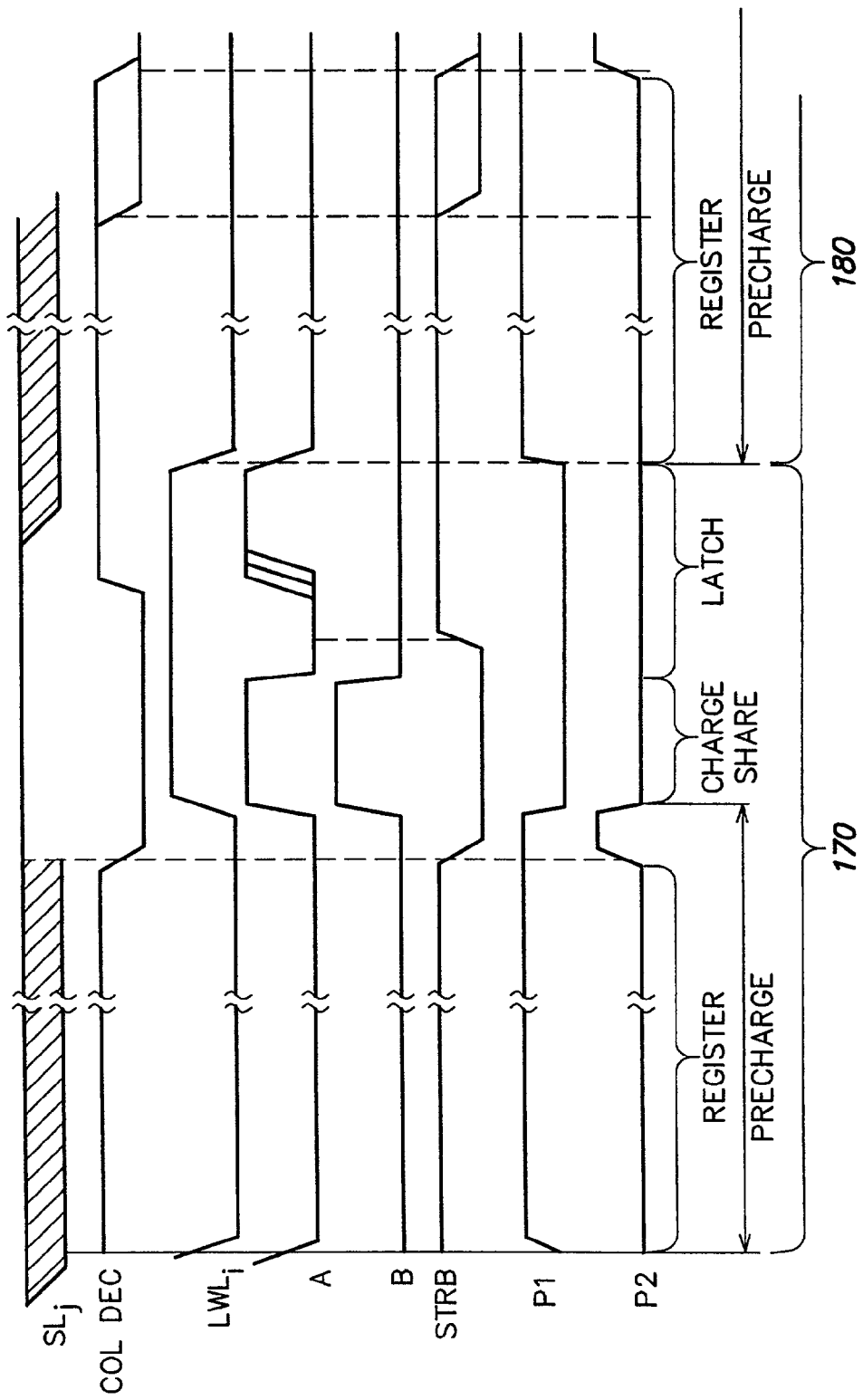
FIG. 7 shows control signal timing that may be used in one embodiment in association with the circuit of FIG. 6 to perform read and write-back operations.

FIG. 7 shows an example the control signal timing that may be used in association with the circuit of FIG. 6 to perform read and write-back operations. The control signal timing includes write-back termination and a register state for the sense/latch circuit. In FIG. 7 there is shown one complete read and write-back operation 170 and part of another read and write-back operation 180. Each of the read and write-back operations 170, 180 have three phases: a pre-charge phase, a charge share phase, and a latch/write-back phase (shown only for operation 170). The pre-charge phase has two parts. In the first part, the sense/latch circuit is in a register state and the bit lines are pre-charged. The control signal timing for the first part of the pre-charge phase is as follows. The $LWL_i$ and A signals transition (or have transitioned) to a low logic state, which isolates memory cell 106 from the bit line $BL_j$, and turns off switch 116, (thereby decoupling the sense/latch circuit 102 from bit line BL). The control signal B is at a low logic state, which decouples the sense/latch circuit 102 from the bit line NOT $BL_j$. The P1 signal is asserted, which causes transistors 148–152 to turn "on", thereby pre-charging bit lines $BL_j$, NOT $BL_j$. The STRB signal remains asserted, and therefore the sense/latch circuit 102 retains the previously latched data. The COL DEC signal remains asserted, which causes transistors 160, 164 to remain on, and causes the signals $SL_j$, NOT $SL_j$ to remain at logic states that indicate the state of the memory cell most recently read (e.g., memory cell 106). That is, if the memory cell 106 is at a high logic state, then the $SL_j$ signal remains at a high logic state and the NOT $SL_j$ signal remains at a low logic state. If, on the other hand, the memory cell 106 is at a low logic state, then the $SL_j$ signal remains at a low logic state and the NOT $SL_j$ signal remains at a high logic state.

In this example, the first part of the pre-charge phase (and the register state of the sense/latch circuit) lasts until a determination is made that the circuit needs to access the memory array. While in the first part of the pre-charge phase (the register state of the sense/latch circuit), the sense/latch circuit(s) retain data previously retrieved from the memory array. If the DRAM receives a request for data, a determination is made as to whether the data is already retained in the sense/latch circuits. If the data is so retained, then the data is retrieved from the sense/latch circuits. This avoids the need to access the memory array and therefore reduces the time needed to supply the requested data. If the data is not currently retained in one of the sense/latch circuits, then the requested data will need to be retrieved from the appropriate memory cells.

The first part of the pre-charge phase (and the register state of the sense/latch circuit) ends when a determination is made that the circuit needs to access the memory array. In second part of the pre-charge phase, the sense/latch circuit is no longer in the register state and the signal lines 112, 122 are pre-charged. The control signal timing for the second part of the pre-charge phase is as follows. Control signals P1, P2 are asserted and the other control signals ($LWL_i$, A, B, STRB and COL DEC) are at a low logic state. With the P1, P2 signals being asserted, transistors 148–152 and transistors 148–152 are "on", thereby pre-charging bit lines $BL_j$, NOT $BL_j$ and signal lines 213, 122 to the pre-charge voltage (e.g., $V_{DD}$). Note that the signal lines $SL_j$, NOT $SL_j$ are also pre-charged to the pre-charge voltage (e.g., $V_{DD}$). Because none of the other control signals ($LWL_i$, A, B, STRB and COL DEC) are asserted, access transistor 108 is off, thereby isolating memory cell 106 from bit line $BL_j$. Switches 116, 126 are also off, thereby isolating the sense/latch circuit (which is in a disabled state) from bit lines $BL_j$, NOT $BL_j$.

In the charge share phase, the pre-charge circuits 100, 101 are off (the P1, P2 signals are at a low logic state) and the $LWL_i$, A, and B signals are asserted. With the $LWL_i$ signal being asserted, the access transistor 108 is on, thereby coupling memory cell 106 to bit line $BL_j$, which causes $BL_j$ and the memory cell to share charge. (Note that the LWL signal is also asserted, and consequently, the transistor 111 is on, thereby coupling reference cell REF2 to bit line NOT $BL_j$, which causes NOT $BL_j$ and the reference cell REF2 to share charge.) Because the A and B signals are asserted, switches 116, 126 are also on, thereby coupling the sense/latch circuit 102 (which remains in a disabled state) to bit lines $BL_j$, NOT $BL_j$.

At the start of the latch/write-back phase, the A, B signals transition (or have transitioned) to a low logic state, which turns off switches 116, 126 and thereby decouples the sense/latch circuit 102 from the bit lines $BL_j$, NOT $BL_j$. The STRB signal is then asserted, which enables the sense/latch circuit 102 to sense and drive the signal lines 112, 122. The signal line with the higher of the two voltages is driven high (e.g., toward $V_{DD}$). The signal line with the lesser of the two voltages, is driven low (e.g., toward zero). The COL DEC signal is then asserted, which causes the transistors 160, 164 to turn on. If the bit line $BL_j$ is at a high logic state, then the signal $SL_j$ remains at a high logic state (recall that signals $SL_j$, NOT $SL_j$ had been pre-charged to the pre-charge voltage, e.g., $V_{DD}$). If the bit line $BL_j$ is at a low logic state, then the signal $SL_j$ transitions to a low logic state. Concurrent with (or some time after) asserting the COL DEC signal, the A signal is re-asserted, so as to turn switch 116 on again, thereby coupling the sense/latch circuit 102 to $BL_j$ for write-back to the memory cell 106. In this way, the data is latched and the voltage in the memory cell is restored. Note that the B signal is not re-asserted because as stated above, there in no need to write-back to the bit line NOT $BL_j$ connected to the reference cell 111.

After the read and write-back operation 170 is completed, the pre-charge phase for read and write-back operation 180 is initiated. As described above, the pre-charge phase has two parts. In the first part, the sense/latch circuit is in a register state and the bit lines are pre-charged. The first part of the pre-charge phase (and the register state of the sense/latch circuit) lasts until a determination is made that the circuit needs to access the memory array. While in the first part of the pre-charge phase (the register state of the sense/latch circuit), the sense/latch circuit(s) retain data previously retrieved from the memory array. If the DRAM receives a request for data, a determination is made as to whether the data is already retained in the sense/latch circuits. If the data is so retained, then the data is retrieved from the sense/latch circuits. In second part of the pre-charge phase, the sense/latch circuit is no longer in the register state and the signal lines 112, 122 are pre-charged. The control signal timing for the read and write-back operation 180 is identical to that described above for the read and write-back operation 170.

Figure 8:
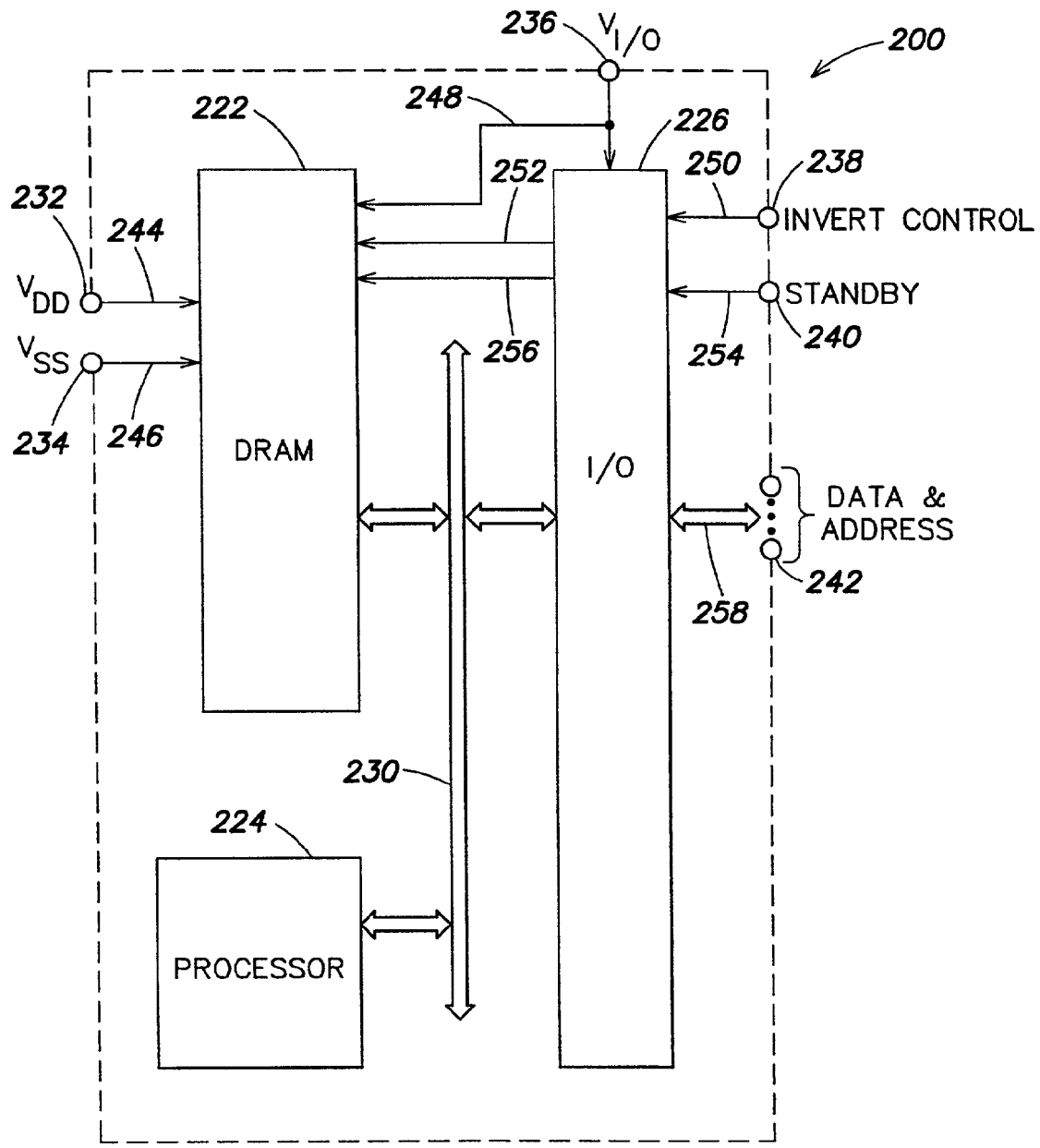
FIG. 8 is a representation of an integrated circuit having an embedded DRAM.

The various aspects of the present invention are further discussed below with respect to an integrated circuit 200 having an embedded DRAM 222, as shown in FIG. 8.

Referring now to FIG. 8, the integrated circuit 200 comprises a DRAM 222, a digital information processor 224 and I/O circuits 226. As will be discussed below, the DRAM 222 employs a plurality of DRAM circuits similar to the DRAM circuit 40 (FIG. 3), as well as embodiments of various aspects of the present invention. Such embodiments include features to (1) pre-charge the bit lines to a voltage that is biased toward a weaker one of two memory cell logic states, (2) selectively store data in a inverted form that reduces the power needed to refresh such data (at least in this embodiment), (3) retain data in the sense/latch circuits and use such circuits as a form of cache to reduce the frequency that memory cells are accessed and thereby reduce memory access time, and (4) supply a reference (e.g., $V_{pp}$) from a circuit that employs an alternate, lower power, operating mode (e.g., if the DRAM is in standby mode). These features are further discussed below.

The digital information processor 224 executes instructions used in carrying out digital processing tasks. The I/O circuits 226 provide signal conditioning for signals supplied into and/or out of the integrated circuit 200. For example, the I/O circuits 226 may include buffer circuits to drive external loads and/or logic level translation circuits. Logic level translation circuits are used in instances where voltage levels used to represent logic states within the integrated circuit are different than voltage levels used to represent logic states external to the integrated circuit 200.

The DRAM 222, the processor 224, and the I/O circuits 226 are interconnected by an internal bus 230. The internal bus 230 may include a plurality of separate buses (e.g., data and address) each of which interconnects two or more of the circuits and/or devices within the integrated circuit 200.

The integrated circuit 200 has numerous pads for providing interconnection points to external terminals (e.g., pins, ball grid arrays, etc., external to the integrated circuit 200) through which signals and/or power are supplied to/from the integrated circuit 200. For example, a $V_{DD}$ pad 232, a $V_{SS}$ pad 234 and a $V_{I/O}$ pad 236 are used to supply provide power to the integrated circuit 200. An INVERT CONTROL pad 238 and a STANDBY pad 240 are used to supply the integrated circuit 200 with an INVERT CONTROL signal and a STANDBY signal, respectively. These signals are further discussed below. Data and address pads, indicated at 242, are used to supply data and address signals to/from the integrated circuit 200.

Signal lines 244, 246 connect the $V_{DD}$, $V_{SS}$ pads 232, 234 to the DRAM 222. Signal lines (not shown) connect these pads 232, 234 to the digital information processor 224 and the I/O circuits 226; such signal lines have been omitted from FIG. 8 to preserve the clarity of the figure. Signal line 248 connects the $V_{I/O}$ pad 236 to the DRAM 222 and the I/O circuits 226. Signal lines 250, 254 connect the INVERT CONTROL pad 238 and the STANDBY pad 240, respectively, to the I/O circuits 226. Signal lines 252, 256 connect the I/O circuits 226 to the DRAM 222. One or more buses, indicated at 258, connect the data and address pads, indicated at 242, to the I/O circuits 226. The one or more buses 258 are referred to hereafter as bus 258.

In operation, the digital information processor 224 fetches instructions (e.g., from the DRAM 222) through the bus 230. The digital information processor 224 executes the instructions and, if appropriate, generates data to be stored in the DRAM 222. The data, and any associated addresses, may be supplied to the DRAM 222 through the bus 230. Data can also be stored to and retrieved from the DRAM by way of the I/O circuits 226. The I/O circuits 226 receive an INVERT CONTROL signal and a STANDBY signal through the signal lines 250, 254, respectively, and produces corresponding signal that are supplied through the signal lines 252, 256 to the DRAM 222. These signals are further discussed below. Data and/or address signals are supplied through the bus 258 to the I/O circuits 226, which generates corresponding signals, which in turn are provided to the bus 230.

It should be recognized that all of these circuits, devices, pads and interconnections may not be needed in every embodiment and therefore are not required. Furthermore, there is no preclusion against the inclusion of other types of circuits, devices, pads and/or interconnections, for example, but not limited to, analog to digital converters, digital to analog converters, and/or other types of digital memory devices.

Figure 9:
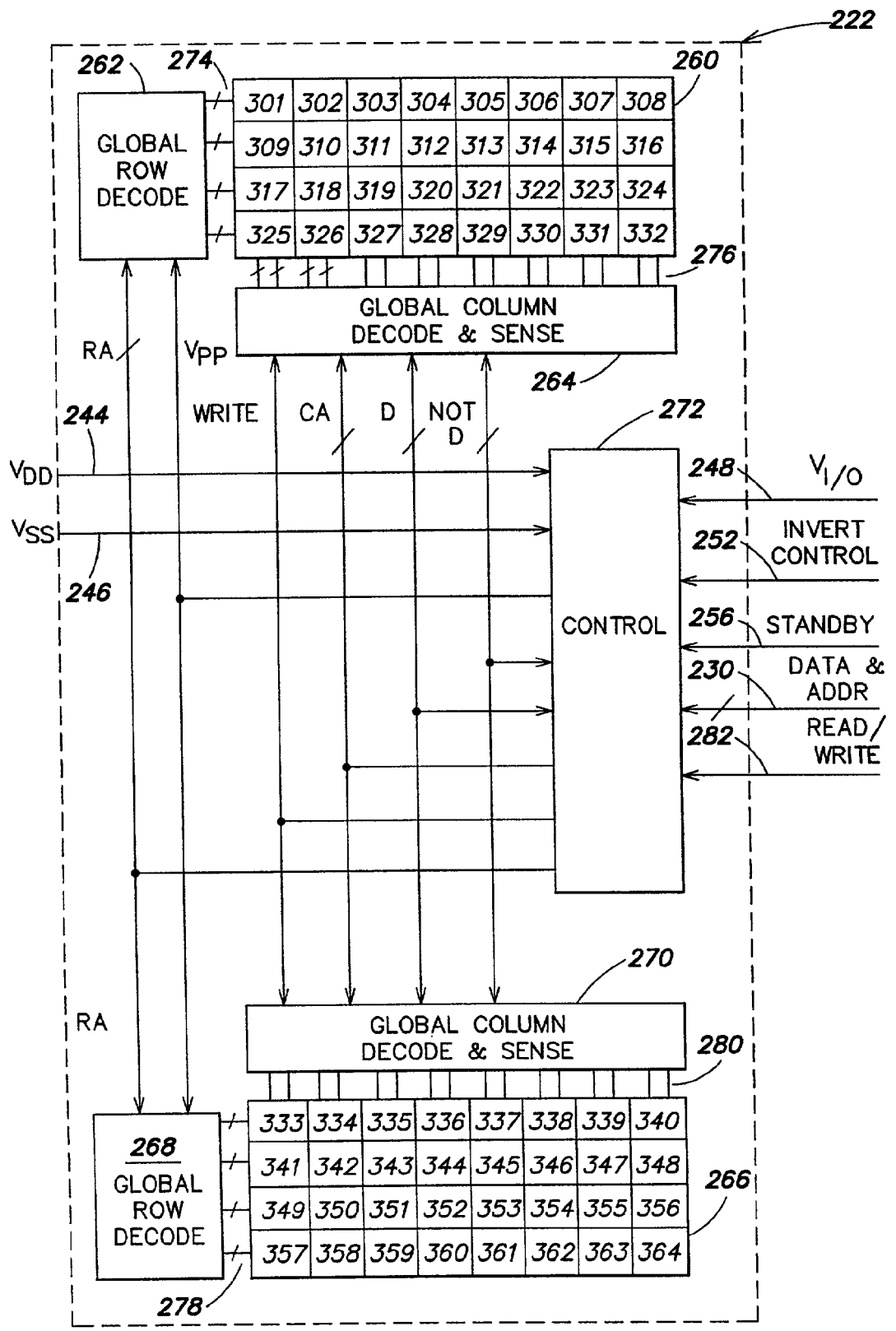
FIG. 9 is a representation of one embodiment of the embedded DRAM of FIG. 8.

FIG. 9 shows one embodiment of the DRAM 222. In this embodiment, the DRAM 222 includes a first memory array 260, a first global row decoder circuit 262, a first global column decode and sense circuit 264, a second memory array 266, a second global row decode circuit 268, a second global column decode and sense circuit 270, and a control circuit 272. The first memory array 260 is coupled to the first global row decode circuit 262 through a first plurality of signals lines, indicated at 274, and is coupled to the first global column decode and sense circuit 264 through a plurality of signal lines, indicated at 276. The second memory array 266 is coupled to the second global row decode circuit 268 through a second plurality of signals lines, indicated at 278, and is coupled to the second global column decode and sense circuit 270 through a plurality of signal lines, indicated at 280.

The control circuit 272 receives the $V_{DD}$, $V_{SS}$, $V_{I/O}$, INVERT CONTROL and STANDBY signals through the signal lines 244, 246, 248, 252 and 256, respectively. The control circuit 272 also receives a READ/WRITE signal through a signal line 282.

Each of the memory arrays 260, 266 is divided into a plurality of sub-arrays. For example, the memory array 260 is divided into 32 sub-arrays, indicated at 301–332, and the memory array 266 is divided into 32 sub-arrays, indicated at 333–364. Each of the sub-arrays 301–332, 333–364 are substantially similar to the DRAM circuit 40 (FIG. 3).

The DRAM is normally in a read mode but may be placed into a write mode by asserting the READ/WRITE signal on signal line 282. In the following discussion, it should be assumed that the DRAM is in a read mode unless otherwise stated.

In operation, an address is supplied through the bus 230 to the control circuit 272. The control circuit 272 decodes the address to generate an RA signal and a CA signal, which collectively identify one or more memory cells in the memory arrays 260, 266. The RA and CA signals are supplied to the first global row decode circuit 262 and the first global column decode and sense circuit 264, respectively, which respond by supplying control signals through signal lines 274, 276 to the sub-arrays 301–332 in the first memory array 260. The RA and CA signals are also supplied to the second global row decode circuit 268 the second global column decode and sense circuit 270, respectively, which respond by supplying control signals through signal lines 278, 280 to the sub-arrays 333–364 in the second memory array 266.

In the case of a memory read operation, the first memory array 260 responds by generating pairs of complementary signals that indicate the logic state of signals stored in selected memory cells in the first memory array 260. The pairs of complementary signals are supplied through the signal lines 276 to the first global column decode and sense circuit 264, which selects one or more of the pairs in accordance with the CA signal, and supplies the selected pair(s) of complementary signals, indicated at D, NOT D, to the control circuit 272. The control circuit 272 receives the complementary signals D, NOT D and generates the complementary signals DATA, NOT DATA signals, as further described below, which are supplied to the bus 230.

If the READ/WRITE signal is asserted on signal line 282, then the DRAM 222 carries out a write operation as follows. The control circuit 272 receives address and data via the DATA &ADDR signals from the bus 230. The control circuit 272 responds by generating the RA, CA signals as described above, to collectively indicate one or more memory cells. In addition, the control circuit generates one or more pairs of complementary signals, indicated at D, NOT D, which are supplied to the first global column decode and sense circuit 264 and the second global column decode and sense circuit 270. In addition, the control circuit asserts the WRITE signal, which is supplied to the first global column decode circuit 264 and the second global column decode circuit 270. The data supplied to the memory array(s) 260, 266 is then stored in the indicated memory cells.

The second global row decode circuit 268 and the second global column decode and sense circuit 270 operate similarly to the first global row decode circuit 262 and the first global column decode and sense circuit 264, respectively.

Figure 10:
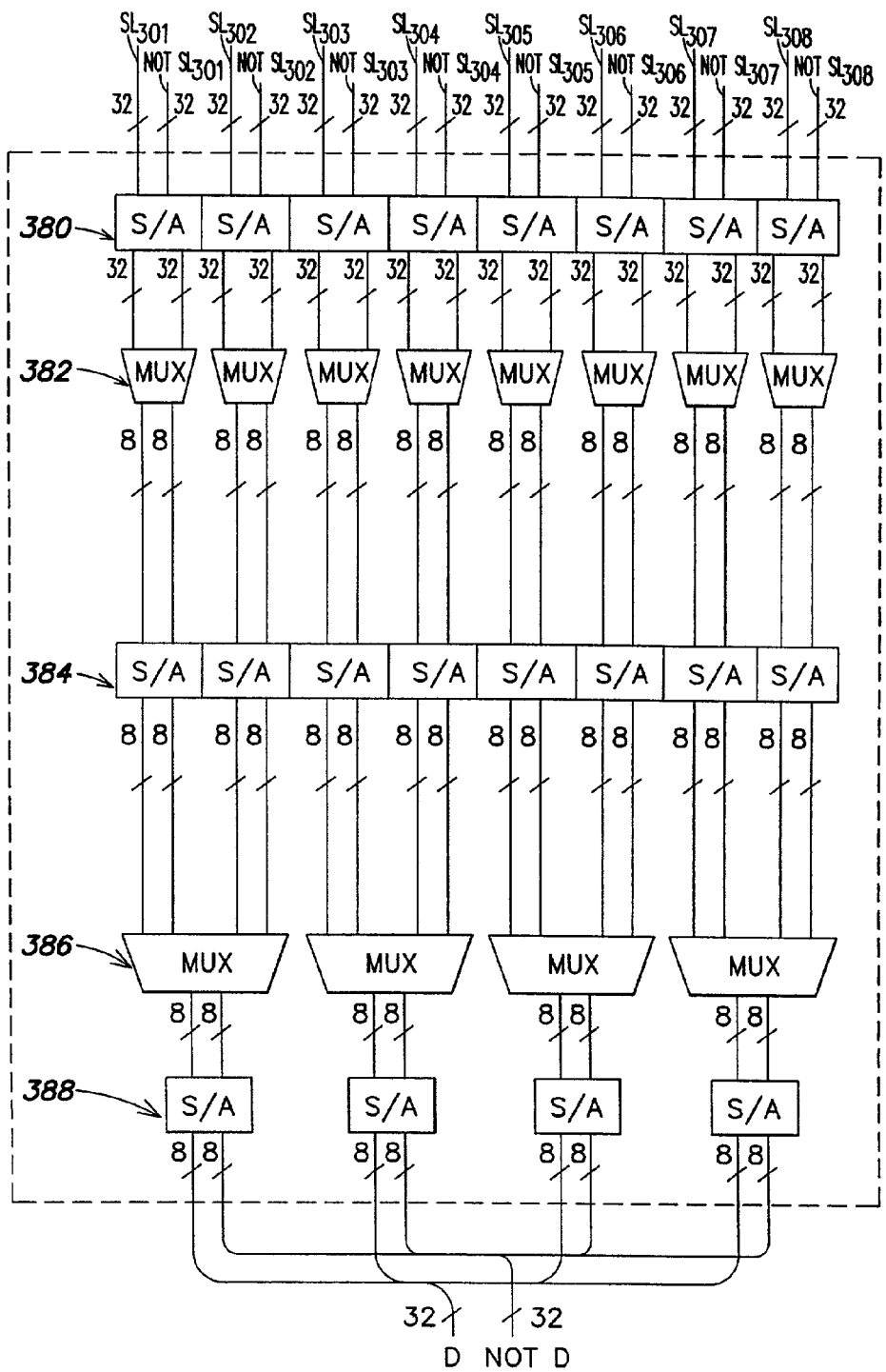
FIG. 10 is block diagram of one embodiment of the global column decode and sense circuit of FIG. 9.

FIG. 10 shows a portion of one embodiment of the global column decode and sense circuit 264 (FIG. 9). In this embodiment, the global column decode and sense circuit 264 has a hierarchical architecture that includes a first bank of sense amplifiers 380 that receive pairs of multi-bit, complementary signals $SL_{301}$, NOT $SL_{301}$, $-SL_{308}$, NOT $SL_{308}$, supplied by the row of sub-arrays 301–308 (FIG. 9) in the first memory array 260 (FIG. 9). Each pair of multi-bit, complementary signals is made up of two 32-bit signals. The first bank of sense amplifiers 380 supplies signals to a first bank of multiplexers 382. Each multiplexer in the first bank of multiplexers 382 selects eight pairs of multi-bit complementary signals in accordance with decoded address signals (not shown). The selected pairs are supplied to a second bank of sense amplifiers 384, which supplies signals to a second bank of multiplexers 386. As with the first bank of multiplexers 382, each multiplexer in the second bank of multiplexers 386 selects eight pairs of multi-bit complementary signals in accordance with decoded address signals (not shown). The selected pairs of multi-bit, complementary signals are supplied to a third bank of sense amplifiers 388, which supplies the signals making up the multi-bit complementary signals D, NOT D.

Figure 11:
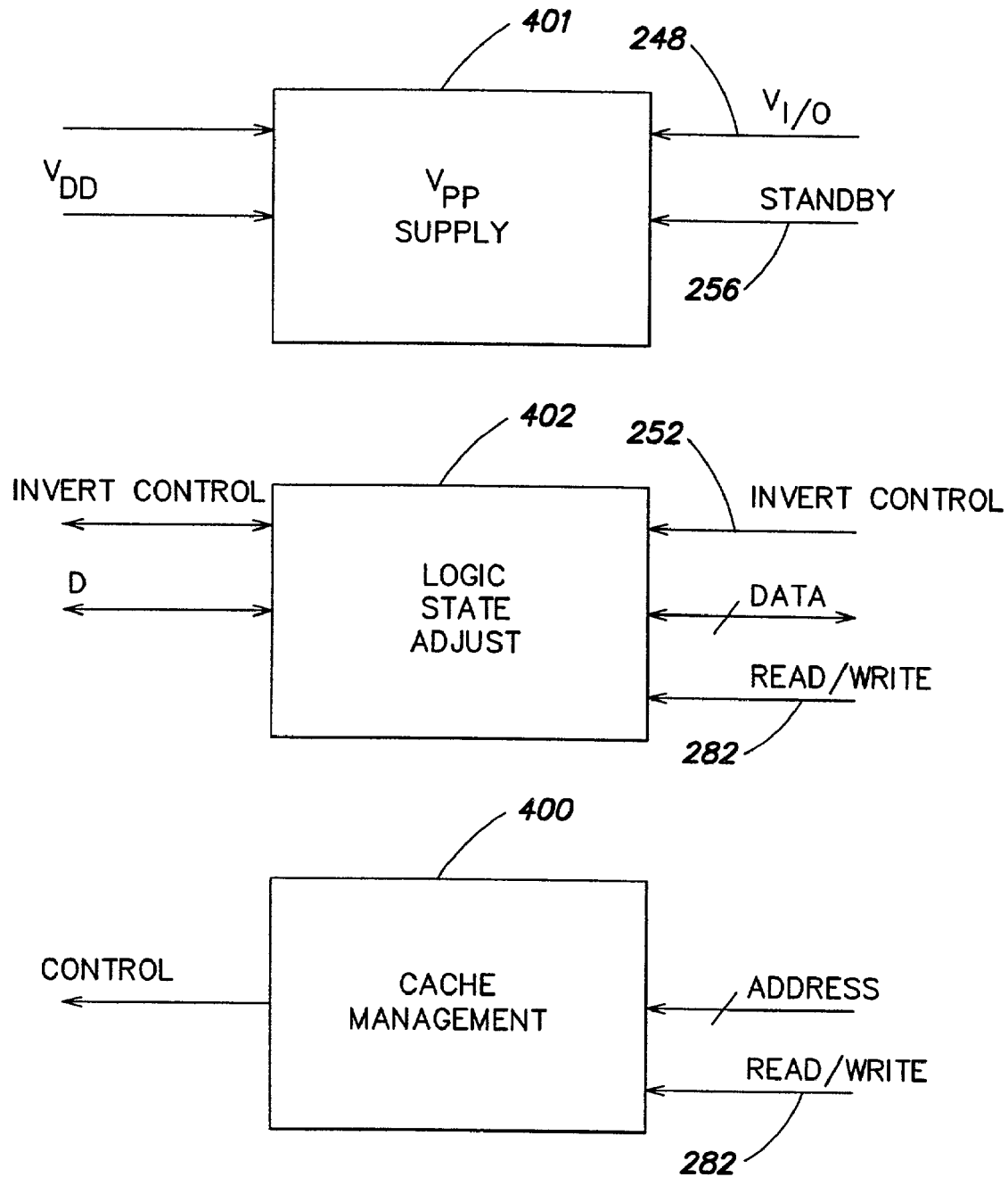
FIG. 11 is a block diagram of one embodiment of the control circuit of FIG. 9.

FIG. 11 shows a block diagram of one embodiment of the control circuit 272. In this embodiment, the control circuit 272 includes a cache management circuit 400, a $V_{PP}$ supply circuit 401 and a logic state adjustment circuit 402.

The cache management circuit 400 controls the use of the data retained in the sense/latch circuits. As stated above, in some embodiments, the sense/latch circuits have a register state in which they retain data retrieved from the memory cells. If the DRAM receives a request for data, the cache management circuit 400 makes a determination as to whether the data is currently retained in one of the sense/latch circuits within the DRAM. If the data is not currently retained in one of the sense/latch circuits, then the requested data is retrieved from the appropriate memory cells. On the other hand, if the data is currently retained in one or more of the sense/latch circuits, then the cache management circuit 400 generates control signal(s) that cause the requested data to be retrieved from the appropriate sense/latch circuit(s). This avoids the need to access the memory array and therefore reduces the time needed to supply the requested data. The sense/latch circuits may be decoupled from the bit lines while retaining data in the register state, so as not to interfere with the bit lines being pre-charged in preparation for a future memory cell access. The cache management circuit 400 is further discussed below with reference to FIG. 14.

The $V_{PP}$ supply circuit 401 generates the $V_{PP}$ supply voltage, which is used within the memory arrays 260, 266. As stated previously, the $V_{PP}$ supply voltage is often generated by a charge pump, which becomes relatively inefficient in standby mode. Indeed, the power needed to run the charge pumps in standby mode is nearly as much as the power needed to run the charge pumps in the active mode, even though the loads are much lower in standby mode. To address this problem, the $V_{PP}$ supply circuit 401 has two operating modes. One operating mode, i.e., a normal operating mode, is used if the DRAM is in the active mode. The other operating mode is a lower power, operating mode that is used if the DRAM is in the standby mode. The availability of an alternative, lower power, operating mode facilitates a reduction in the power required by the DRAM during the standby mode. The $V_{PP}$ control circuit 401 is further discussed below with reference to FIGS. 15, 16.

The logic state adjust circuit 402 provides the capability to store data in an inverted form, and is therefore usable to help reduce the amount of power required to refresh data that is made up mostly of 0's (the higher refresh power logic state). As previously stated, if write-back termination is employed, the amount of power needed to refresh a memory cell at a high logic state (e.g., as in FIG. 4) is less than the amount of power needed to refresh a memory cell at a low logic state (e.g., as in FIG. 5.) This means that the amount of power required to refresh data made up mostly of 1's is less than the amount of power required to refresh data that is made up mostly of 0's, all else being equal.

Note that in this embodiment, the high logic state may be referred to as the "lower refresh power logic state". The low logic state may be referred to as the "higher refresh power logic state". It should be understood however, that in some DRAMs, the amount of power needed to refresh a memory cell at a low logic state is less than the amount of power needed to refresh a memory cell at a high logic state. In such DRAMs, the low logic state is the "lower refresh power logic state", and the high logic state is the "higher refresh power logic state".

With the aid of the logic state adjust circuit 402, data having more 0's than 1's can be inverted (so that the data then has more 1's than 0's), and stored in the memory space in its inverted form, which in effect reduces the amount of power needed to refresh the data. If the data is stored in an inverted form, the data is preferably re-inverted when retrieved, thereby returning the data to its original form.

In this embodiment, the logic state adjust circuit 402 is coupled to signal lines for the INVERT CONTROL, DATA, READ/WRITE and D signals. The operation is as follows. In the case of a write, the logic state adjustment circuit 402 receives INVERT CONTROL and DATA signals and supplies the D signal. If the INVERT CONTROL signal is asserted, then the D signal supplied by the circuit 402 is inverted compared to DATA. If the INVERT CONTROL signal is not asserted, then D has the same form as DATA. In the case of a read, the logic state adjustment circuit 402 receives the INVERT CONTROL signal and D and supplies the DATA signal. If the INVERT CONTROL signal is asserted, then DATA supplied by the circuit is inverted compared to D, thereby returning the data to its original form. If the INVERT control signal is not asserted, then DATA has the same form as D.

In this embodiment, the logic states stored in the memory cells are inverted, on a bit by bit basis, compared to the logic states that would normally be stored for the data. For example, if the logic states that would normally be stored are:

| 10000000 | 00010000 | 00000001 |
|---|---|---| then the logic states obtained by storing the data in an inverted form are:

| 01111111 | 11101111 | 11111110 |
|---|---|---|

This aspect of the present invention should not be confused with topological scrambling, a feature employed by many DRAMs. In topological scrambling, particular data bits of particular memory addresses are always stored in an inverted form. All other data bits are always stored in a non-inverted form. The definition of which bits are stored in an inverted form and which bits are stored in a non inverted form is part of the definition of a DRAM, i.e., fixed by the mask for the DRAM. Thus, there is no way to control whether particular bits in particular addresses are stored in an inverted form or in a non-inverted form without changing the mask.

In contrast to topological scrambling, this aspect of the present invention provides the ability to control whether particular bits in particular addresses are stored in an inverted form or in a non-inverted form without changing the mask. However, the phrases "stored in an inverted form" and "stored in a non-inverted form" are not meant to preclude the use of topological scrambling association with this aspect of the present invention. Indeed, it is expected that many embodiments of this aspect of the present invention will also employ topological scrambling. Moreover, the phrase "stored in an inverted form" means that one or more of the bits in the stored form of the data are inverted as compared to what would otherwise be stored, without changing the mask.

Note that the phrase "selectively store in an inverted form" and the phrase "selectively store the data in either an inverted form or a non-inverted form" each implies the ability to store in an inverted form and in a non-inverted form without changing the mask. Similarly, the phrase "selectively inverting" requires the ability to invert and not invert, without changing the mask. Also note that the phrase "in response to" means "in response at least to" so as not to preclude being responsive to more than one thing. The phrase "based on" means "based at least on" so as not to preclude being based on more than one thing.

Note that if a DRAM employs topological scrambling, it may be desirable to take the definition of such into consideration when determining whether or not to store the data in an inverted form. For example, if the data to be stored has more 0's than 1's but the topological scrambling for the DRAM will cause the stored form to have more 1's than 0's, then it may be undesirable to invert the data because that would cause the stored form to have more 0's than 1's.

Figure 12A:
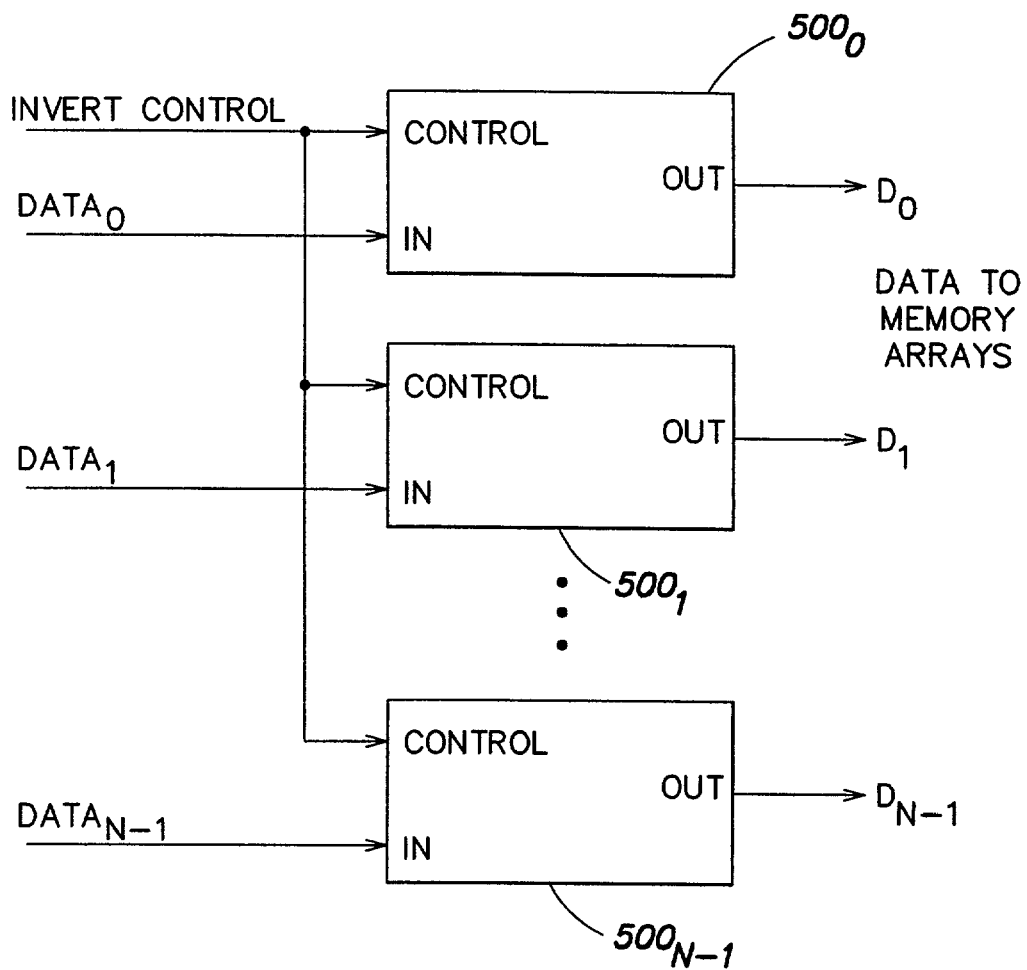
FIG. 12A is a block diagram of one portion of one embodiment of the logic state adjust circuit of FIG. 11.

FIG. 12A is a schematic diagram of a portion of the logic state adjust circuit 402 in accordance with one embodiment of one aspect of the present invention. This portion, which is used when the DRAM is in the write mode, includes N programmable inverters (one for each bit in the DATA and D signals), three of which are shown, i.e., $500_0$, $500_1$, $500_{N-1}$. The N programmable inverters $500_0$, $500_1$, $500_{N-1}$ are all identical to one another. Each programmable inverter has two inputs, indicated at CONTROL and IN, and one output, indicated at OUT. The CONTROL input of each of the programmable inverters $500_0$, $500_1$, $500_{N-1}$ receives the INVERT CONTROL signal. The IN input of each of the programmable inverters receives a respective bit of the DATA signal. The output, indicated at OUT, supplies a respective bit of the D signal. The operation is as follows. If the INVERT CONTROL signal is asserted, then $D_i$ (which is supplied by the logic state adjust circuit 402 when the DRAM is in the write mode) is inverted compared to $DATA_i$. If the INVERT CONTROL signal is not asserted, then $D_i$ is not inverted compared to $DATA_i$.

Figure 12B:
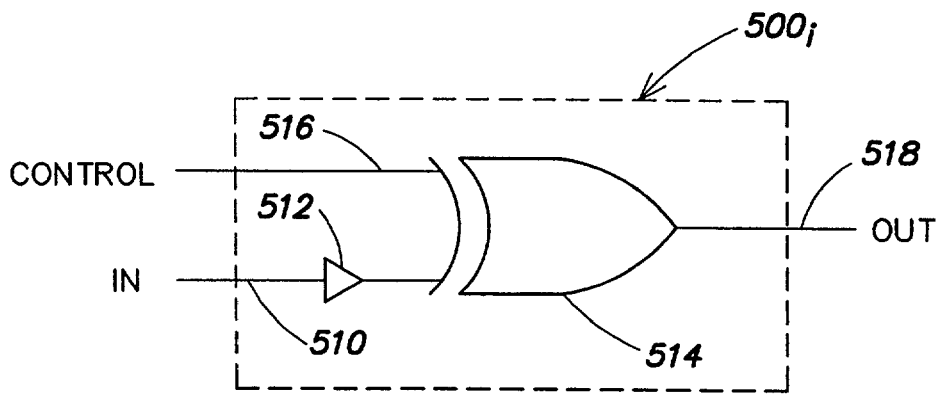
FIG. 12B is a schematic diagram of one embodiment of the programmable inverter used in the logic state adjust circuit of FIG. 12A.

FIG. 12B shows one implementation of a programmable inverter $500_i$ (FIG. 12A). In this implementation, the signal received at IN is supplied through a signal line 510 to a buffer 512. The output of the buffer 512 is supplied to a first input of an EXCLUSIVE OR ("XOR") gate 514. The signal received at CONTROL is supplied through a signal line 516 to a second input of the XOR gate 514. The output of the XOR gate 514 is supplied on a signal line 518 to the output, OUT.

Figure 12C:
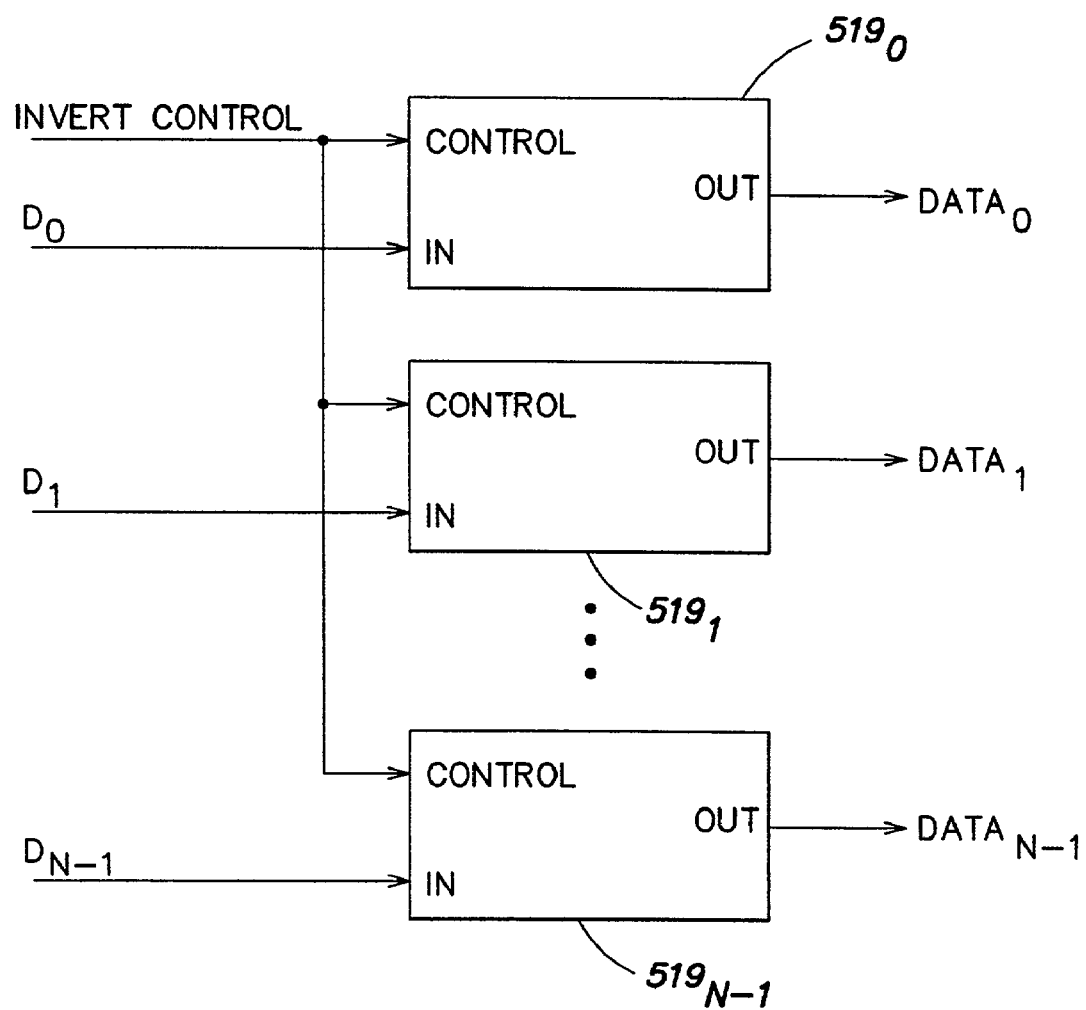
FIG. 12C is a block diagram of another portion of one embodiment of the logic state adjust circuit of FIG. 11.

FIG. 12C is a schematic diagram of another portion of the logic state adjust circuit 402 in accordance with one embodiment of one aspect of the present invention. This portion, which is used when the DRAM is in the read mode, also includes N programmable inverters (one for each bit in the DATA and D signals), three of which are shown, i.e., $519_0$, $519_1$, $519_{N-1}$. The N programmable inverters $519_0$, $519_1$, $519_{N-1}$ are identical to the programmable inverters $500_0$, $500_1$, $500_{N-1}$ (FIG. 12A). The CONTROL input of each of the programmable inverters $519_0$, $519_1$, $519_{N-1}$ receives the INVERT CONTROL signal. The IN input receives a respective bit of the D signal. The output, OUT, supplies a respective bit of the DATA signal. The operation is as follows. If the INVERT CONTROL signal is asserted, then $DATA_i$ (which is supplied by the logic state adjust circuit 402 when the DRAM is in the read mode) is inverted compared to $D_i$. If the INVERT CONTROL signal is not asserted, then $DATA_i$ is not inverted compared to $D_i$.

The INVERT CONTROL signal may or may not be stored within the DRAM. If the INVERT CONTROL signal is not stored within the DRAM, then it may be desirable to set and maintain the INVERT CONTROL signal at a desired logic state. Otherwise, the DRAM may have difficulty re-inverting the data as appropriate (to restore the data to its original form). In some embodiments, the DRAM latches the logic state of the INVERT CONTROL signal on reset or power up, and uses the latched value until the next reset or power up.

This embodiment of the logic state adjust circuit 402 may be particularly useful, for example, in applications where much of the data to be stored is known in advance of storing any data in the DRAM. For example, program code will usually be known in advance of storing data in the DRAM, and therefore, the code and the definition of any topological scrambling can be used to determine whether to assert the INVERT CONTROL signal. The INVERT CONTROL signal may for example be asserted if the code and the topological scrambling result in more 0's than 1's. Otherwise, the INVERT CONTROL signal may not be asserted.

It should be recognized that this aspect of the present invention is not limited to the embodiment of FIGS. 11–12B. Indeed, a logic state adjust circuit may be implemented in any manner.

Figure 13A:
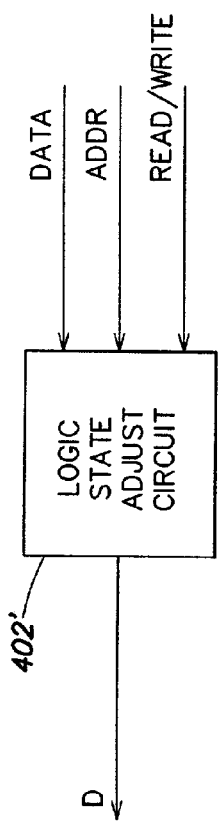
FIG. 13A is a block diagram of another embodiment of a logic state adjust circuit.

FIG. 13A shows another embodiment of a logic adjust circuit 402'. In this embodiment, the logic state adjust circuit 402' makes the determination as to whether or not the data should be stored in an inverted form. In this embodiment, this determination is made on an address by address basis, for example based on the data to be stored and any topological scrambling for that address. In order to be able to re-invert the data as appropriate, the logic state adjust circuit stores information that indicates whether or not the data at each address was inverted. This may-but need not-make use of memory cells in the memory array. For example, each address may have an additional memory cell that can be used to store information that indicates whether or not the data at that address was inverted.

Figure 13B:
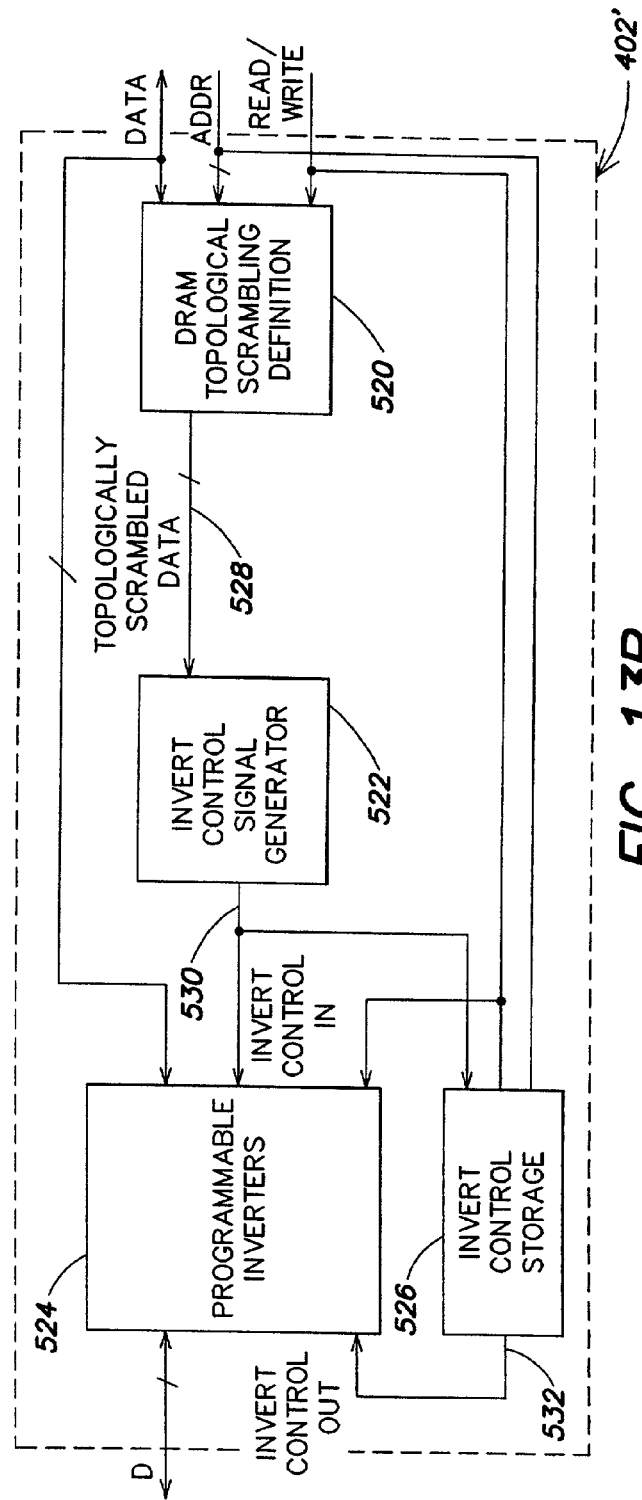
FIG. 13B is a block diagram of one embodiment of the logic state adjust circuit of FIG. 13A.

FIG. 13B shows one implementation of the logic state adjust circuit 402' of FIG. 13A. In this implementation, the logic state adjust circuit 402' comprises a DRAM topological scrambling definition circuit 520, an invert control signal generator 522, a bank of programmable inverter circuits 524 and invert control storage 526.

In the case of a write, DATA and ADDR signals are supplied to the DRAM topological scrambling definition circuit 520, which generates information that indicates the form of the data that would be stored based on the data and the topological scrambling for the DRAM (and assuming that the data is not inverted by the logic state adjust circuit). This information is supplied via a signal line 528 to the invert control signal generator 522 which determines whether or not the data should be stored in an inverted form. The invert control signal generator 522 may, for example, base this determination on the number of 1's and 0' that would be stored based on the data and the topological scrambling. If the data to be stored has more 0's than 1's then the invert control signal generator 522 asserts the INVERT CONTROL IN signal. On the other hand, if the data to be stored based on the data and the topological scrambling has more 1's than 0's then the invert control signal generator 522 does not assert the INVERT CONTROL IN signal. The INVERT CONTROL IN signal is supplied via a signal line 530 to the bank of programmable inverters 524 and the INVERT CONTROL signal storage 526. The bank of programmable inverters 524 is further coupled to signal lines for the DATA, READ/WRITE and D signals, and may operate substantially similar to the logic state adjust circuit 402 of FIG. 12A. Thus, if the INVERT CONTROL IN signal is asserted, then the D signal supplied by the bank of programmable inverters 524 is inverted compared to DATA. If the INVERT CONTROL signal IN is not asserted, then D has the same form as DATA.

In the case of a read, the INVERT CONTROL OUT signal storage 526 generates an INVERT CONTROL OUT signal that indicates whether the data (at an address indicated by the ADDR signal) was stored in an inverted form. The INVERT CONTROL OUT signal is supplied via a signal line 532 to the bank of programmable inverter circuits 524. If the INVERT CONTROL OUT signal is asserted, then the DATA supplied by the bank of programmable inverters 524 is inverted compared to D, thereby returning the data to its original form. If the INVERT control signal is not asserted, then DATA has the same form as D.

In some other embodiments, a logic state adjust circuit may not itself make the determination as to whether the data should be stored in an inverted form, but may nonetheless be able to accept and store a unique INVERT CONTROL signal for each address (or any other subset of the memory arrays).

It should be recognized that this aspect of the present invention is not limited to applications where the high logic state is the lower refresh power logic state. For example, in some other embodiments, the high logic state is the higher refresh power logic state. In such embodiments, if data has more 1's than 0's, it may be desirable to invert such data (so that it then has more 1's than 0's), and store the data in an inverted form, so as to reduce the amount of refresh power needed to retain the data. The data is preferably re-inverted when retrieved. Furthermore, in some other embodiments, there may not be a high refresh power logic state or a low refresh power logic state. That is, the amount of power needed to refresh a memory cell at a one logic state may be approximately the same as the amount of power needed to refresh a memory cell at another logic state.

It should also be recognized that there is no requirement that the data be inverted on a bit by bit basis. For example, some embodiments may invert only certain bits. Other embodiments may use other schemes. Moreover, although the embodiments described above invert the data before the data is stored in the memory cells, it should be understood that the data could be inverted before, during, and/or after storing the data in the memory cells.

Figure 14:
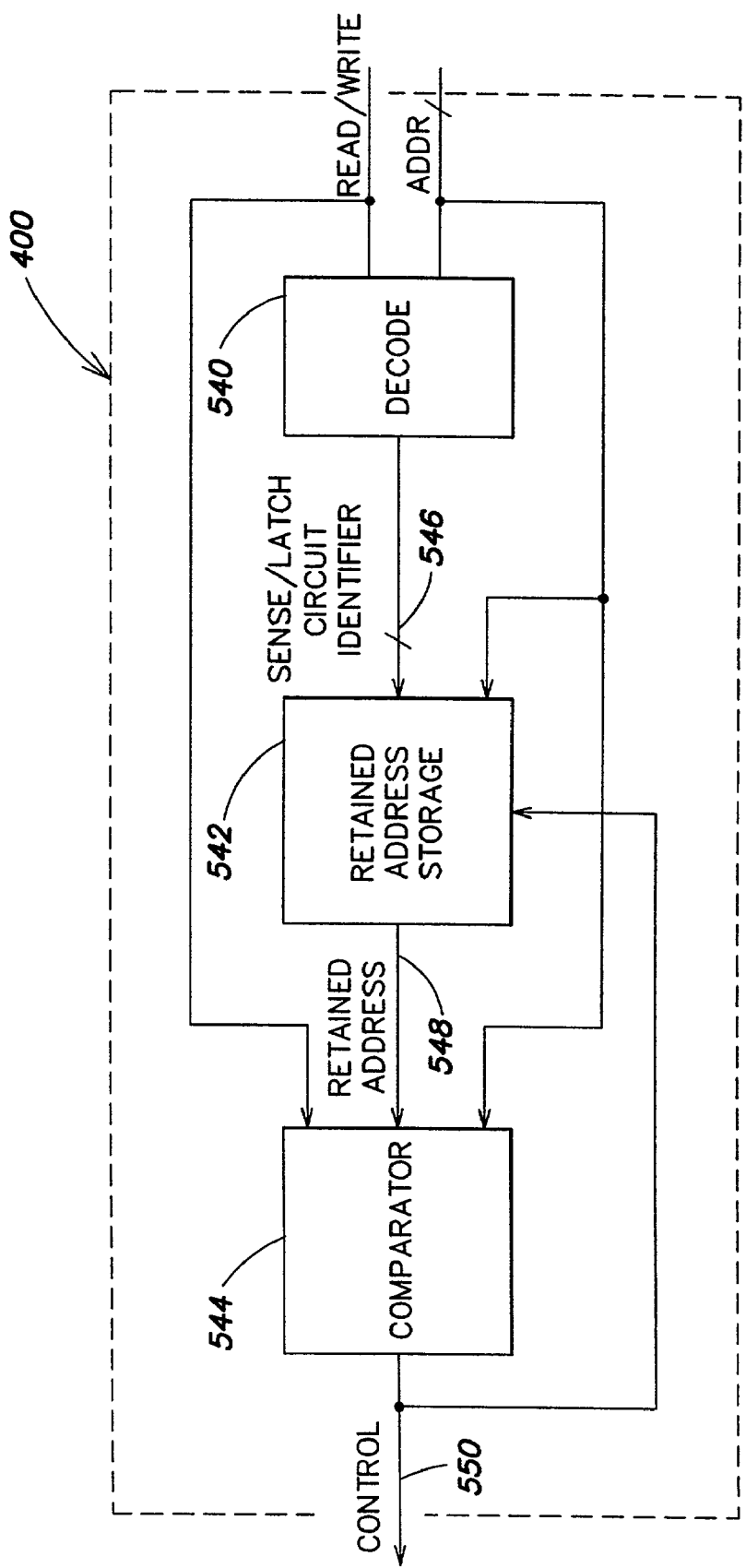
FIG. 14 is a block diagram of one embodiment of the cache management circuit of FIG. 11.

FIG. 14 shows a block diagram of cache management circuit 400 (FIG. 11) in accordance with one embodiment of one aspect of the present invention. In this embodiment, the cache management circuit 400 includes a decode circuit 540, a retained address storage 542, and a comparator 544. In the case of a read, the decode circuit 540 receives an ADDR signal that indicates the address of data to be retrieved from the DRAM. The decode circuit 540 decodes the address and outputs a signal, sense/latch circuit identifier, that indicates which one (or which group) of the sense/latch circuits is associated with the particular address. The sense/latch circuit identifier is supplied via signal lines 546 to the retained address storage 542, which maintains information that indicates which addresses are currently retained in each of the sense/latch circuits. The retained address storage 542 outputs a signal, retained address, that indicates the address(es) that are currently retained in the associated sense/latch circuit(s). The retained address signal 542 is supplied through a signal line 548 to the comparator 544, which compares the address(es) currently retained in the associated sense/latch circuit(s) to the address of the data to be retrieved. The comparator 544 outputs a control signal, on a signal line 550, that indicates whether or not the data to be retrieved is currently retained is the associated sense/latch circuit(s). The control signal instructs the memory arrays as to whether to data should be retrieved from the memory cells or from the a sense/latch circuit. If the data is not currently retained in one of the sense/latch circuits, then the requested data will be retrieved from the appropriate memory cells. The retained address storage 542 is updated, in accordance with the address to be retrieved from the memory cells, so as to properly indicate the address currently retained in the appropriate sense/latch circuit(s). If, on the other hand, the data is currently retained in one or more of the sense/latch circuits, then the requested data will be retrieved from the appropriate sense/latch circuit(s), instead of from the memory cells, thereby eliminating the need to access the memory cells and reducing the time needed to supply the requested data.

It should be understood that any of the sense/latch circuits in the DRAM 222 may be used as registers to retain data for use as a cache. This includes but is not limited to the sense/latch circuits in each of the sub-arrays 301–364 as well as the banks of sense/latch circuits employed in hierarchical architectures of the first global column decode and sense circuit 264 and the second global column decode and sense circuit 270.

Figure 15:
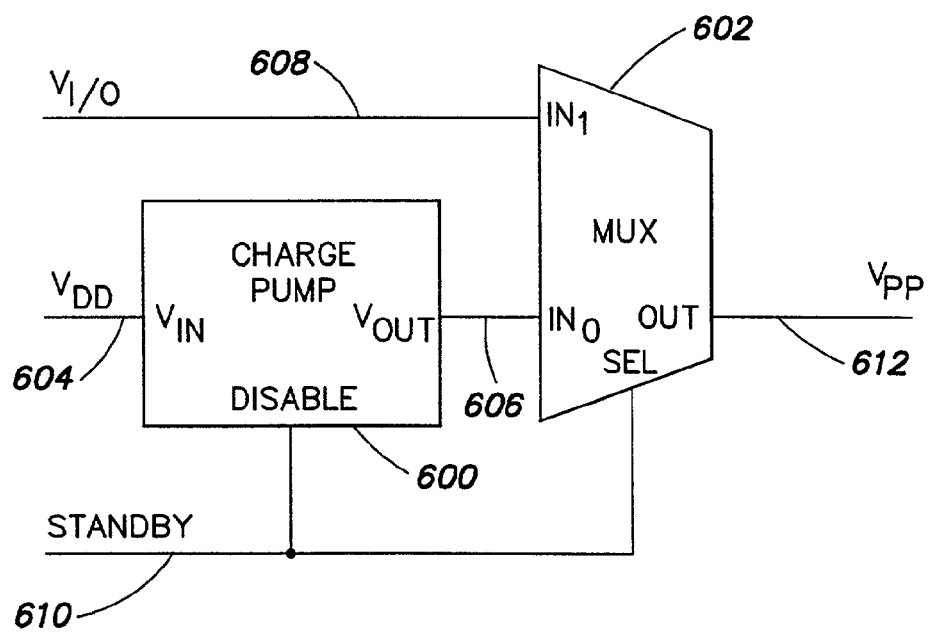
FIG. 15 is a schematic diagram of one embodiment of the $V_{PP}$ supply circuit of FIG. 11.

FIG. 15 shows a $V_{PP}$ supply circuit 401 (FIG. 11) according to one embodiment of one aspect of the present invention. In this embodiment, the $V_{PP}$ supply circuit includes a charge pump 600 and an analog multiplexer 602. Note that a charge pump is a form of dc—dc converter. The charge pump 600 is powered by the $V_{DD}$ supply, which supplies a voltage (e.g., 1 volt) through a signal line 604 to an input $V_{in}$. The charge pump 600 has an output, $V_{out}$, that provides a voltage (e.g., 2.5 volts), which is supplied through a signal line 606 to one input, IN0, of the analog multiplexer 602. A second input, IN1, of the analog multiplexer 602 receives the $V_{I/O}$ signal (e.g., 2.5 volts) through a signal line 608. The STANDBY control signal is provided on a signal line 610, which is supplied to a disable input, DISABLE, of the charge pump 600 and to a control input, SEL, of the analog multiplexer 602. The output of the analog multiplexer 602 is the $V_{PP}$ signal, which is supplied through a signal line 612 to one or more loads (e.g., the word lines and/or the pre-charge circuits) within the DRAM 222.

The operation of the circuit is as follows. If the STANDBY signal is not asserted (i.e., the DRAM is in the active mode), then the charge pump is enabled and generates an output voltage. The output voltage from the charge pump is supplied to the analog multiplexer 602, which selects the output from the charge pump 600 as the $V_{PP}$ supply. If the STANDBY control signal is asserted (i.e., the DRAM is in the standby operating mode) then the charge pump 600 is disabled and the analog mulitplexer 602 selects the $V_{I/O}$ supply signal as the $V_{PP}$ supply.

Thus, in this embodiment, the $V_{PP}$ supply circuit has two operating modes. If the DRAM is in the normal mode, the $V_{PP}$ supply voltage is generated by a charge pump that is powered by the $V_{DD}$ supply voltage. If the DRAM is in the standby mode, the charge pump is bypassed and the $V_{PP}$ supply voltage is supplied from an alternate source, e.g., from the $V_{I/O}$ supply provided to the DRAM. The charge pump may be shut down, which significantly reduces the power required by the DRAM in the standby mode, although there is no requirement to do so.

Figure 16:
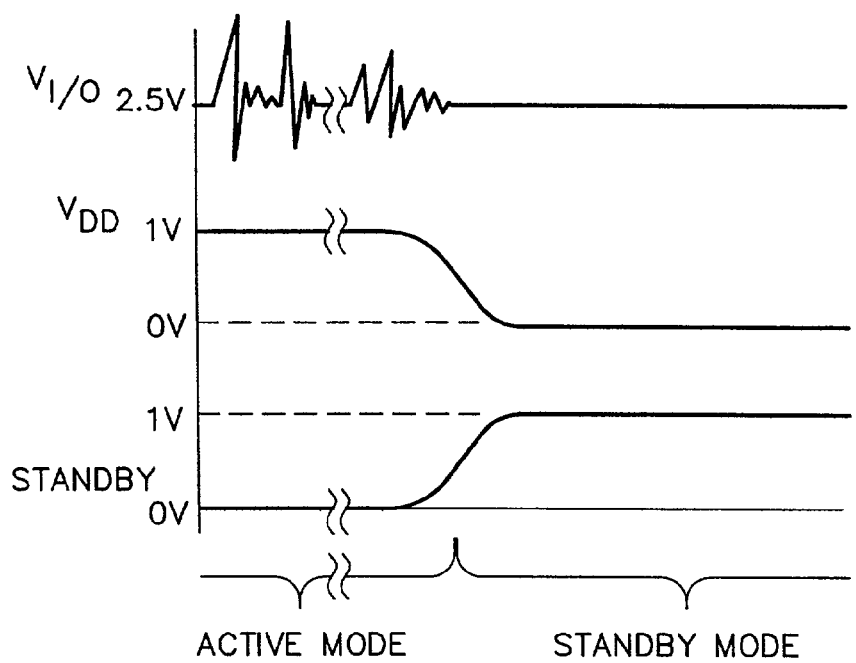
FIG. 16 shows waveforms of signals used in one embodiment of the $V_{PP}$ supply circuit of FIG. 15.

FIG. 16 shows typical waveforms for the $V_{DD}$, $V_{I/O}$, and STANDBY signals during the active and standby modes. Note the $V_{I/O}$ signal has a dc value that is equal to (or at least approximately equal to) the $V_{PP}$ supply voltage (e.g. 2.5 volts) provided by the charge pump. Note that the $V_{I/O}$ supply is noticeably "noisier" in the active mode than in the standby mode. The $V_{I/O}$ supply is in fact too noisy to be used as the $V_{PP}$ supply voltage in the active mode. It is however, "quiet" enough to be used as the $V_{PP}$ supply in the standby mode.

Note that the multiplexer may comprise any type of selection circuitry. Also note however, that this aspect of the present invention is not limited to use of a multiplexer, but rather may employ any type of circuitry to bypass the charge pump.

Although discussed with respect to a circuit that uses a charge pump and/or a $V_{I/O}$ supply in association with the $V_{PP}$ supply, it has been recognized that this aspect of the present invention is not limited to charge pumps, the $V_{I/O}$ supply and/or the $V_{PP}$ supply. Rather, this aspect of the present invention may employ any type of dc—dc converter in association with any supply voltage in the DRAM. Note that there are various types of dc—dc converters including but not limited to boost types, in which the output voltage is greater than the input voltage, and buck types, in which the output voltage is less than the input voltage.

It has also been recognized that this aspect of the present invention is not limited to use in association with standby mode, but rather may be used in association with any operating mode or modes of the DRAM.

Although the various embodiments have been shown in which the asserted logic state for the signals is a high logic state (e.g., a 1), it should be understood that in some embodiments, the asserted logic state for one or more signals may be the low logic state.

It has been recognized that the various aspects of the present invention may be employed in any type of DRAM, whether embedded or not. The DRAM may have any form, including but not limited to for example, planar, stacked, and/or trench cell. It has been recognized that some deep trench cell DRAMs have higher parasitic cell resistances than either planar or stacked DRAMs and therefore may see the greatest benefit from some aspects of the present invention.

Many CMOS DRAMs employ CMOS technology throughout the DRAM except for in the memory array, for example in the decoding and the sensing circuits. However, as used herein, the term CMOS DRAM simply refers to a DRAM that employs CMOS technology. Thus, a DRAM that has even one circuit implemented in CMOS technology is, for purposes herein, referred to as a CMOS DRAM.

It should be understood that the various control circuits described herein need not be located within any particular portion of the DRAM. For example, in some embodiments that incorporate various aspects of the present invention, the associated control circuits are distributed throughout the DRAM. Furthermore, any one of the circuits described herein need not be confined to a any one particular portion of the DRAM. For example, in some embodiments, a circuit may be distributed throughout one or more portions of the DRAM. Moreover, it should be understood that one or more portions of a circuit may be shared with one or more other circuits. Indeed, entire circuits may be shared. For example, the decode circuit employed in the cache management circuit 400 of FIG. 14 may also be used by the global and/or local decode circuits for the memory arrays.

It should also be understood that in some embodiments, the DRAM does not receive the INVERT CONTROL signal and/or the STANDBY signal directly from the I/O circuits 226, but rather receives the INVERT CONTROL signal and/or the STANDBY signal through an indirect path from the I/O circuits 226. Moreover, it should be understood that in some embodiments, the INVERT CONTROL signal and/or the STANDBY signal are generated from a source within the integrated circuit, for example by the digital information processor 224 or by the DRAM, instead of being provided through the I/O circuits 226.

The term "coupled to" means "coupled directly to" or "coupled indirectly to", so as not to preclude being operatively coupled. Likewise, the term "connected to" means "connected directly to" or "connected indirectly to", so as not to preclude being operatively connected.

Field effect transistors (FETs)are typically majority carrier devices. It should be understood that the term FET ("Field Effect Transistor"), as used herein, refers to any type of FET including but not limited to for example dual gate and other modified gate structure devices.

Although disclosed with respect to various embodiments employing a voltage source, it should be understood that pre-charging can be carried out in any way. For example, some embodiments may use a pre-charging circuit that makes use of a current source.

While there have been shown and described various embodiments, it will be understood by those skilled in the art. The present invention is not limited to such embodiments, which have been presented by way of example only, and at various changes and modifications may be made without departing from the spirit and scope of the invention. In addition, it should also be understood that each of the various aspects of the present invention may be used alone or in combination with one or more of the other aspects. Moreover, there is no requirement that any aspect of the present invention provide the advantages described with respect to the DRAM circuit 400 or the DRAM 222. Accordingly, the invention is limited only by the appended claims and equivalents thereto.

What is claimed is:

1. A dynamic random access memory (DRAM) that comprises a read mode having a pre-charge state, the DRAM comprising:
    a memory space having a plurality of memory cells, at least a subset of the memory cells being capable of storing signals corresponding to a first logic state or a second logic state, wherein one of the logic states is weaker than the other logic state;
    a plurality of logic circuits, at least one of which comprises CMOS logic;
    a plurality of bit lines for reading and writing data to the at least a subset of the memory cells; and
    a circuit to, in the pre-charge state, pre-charge at least a first one of the bit lines to a predetermined voltage biased toward the weaker logic state, wherein the weaker logic state is a low logic state, and wherein the circuit to pre-charge comprises a pull down transistor coupled between the first one of the bit lines and a first supply voltage, wherein the pull down transistor is a P channel FET.

2. The DRAM of claim 1, wherein the circuit to pre-charge is further adapted to, in the pre-charge state, pre-charge at least a second one of the bit lines to a second predetermined voltage biased toward a second weaker logic state, wherein the second weaker logic state is a logic high state, and wherein the circuit to pre-charge comprises a pull up transistor coupled between the second one of the bit lines and a second supply voltage.

3. The DRAM of claim 1, wherein the plurality of combinatorial logic circuits comprises a decoder circuit for indicating one or more of the memory cells, and wherein the pull down transistor comprises a control input coupled to the decoder circuit, and being connected between one of the indicated memory cells and one of the plurality of bit lines.

4. The DRAM of claim 1, wherein the predetermined voltage is substantially equal to $V_{SS}$.

5. The DRAM of claim 1, further comprising a sense circuit that is coupled to the plurality of bit lines and outputs a signal that indicates the logic state of the memory cell being read.

6. The DRAM of claim 5, wherein the sense circuit comprises CMOS logic.

7. The DRAM of claim 1, wherein the memory space is arranged as a matrix of rows and columns.

8. The DRAM of claim 1, wherein the memory space comprises reference cells.

9. An integrated circuit comprising an embedded DRAM such as recited in claim 1.

10. The integrated circuit of claim 9, further comprising a digital information processor.

11. A battery powered device having an integrated circuit such as recited in claim 9.

12. The battery powered device of claim 11, wherein the integrated circuit further comprises a digital information processor.

13. A dynamic random access memory (DRAM) that comprises a read mode having a pre-charge state, the DRAM comprising:
    a memory space having a plurality of memory cells, at least a subset of the memory cells being capable of storing signals corresponding to a first logic state or a second logic state, wherein one of the logic states is weaker than the other logic state;
    a plurality of logic circuits, at least one of which comprises CMOS logic;
    a plurality of bit lines for reading and writing data to the at least a subset of the memory cells; and
    means for pre-charging at least a first one of the bit lines to a predetermined voltage biased toward the weaker logic state in the pre-charge state, wherein the weaker logic state is a low logic state, and wherein the means for pre-charging comprises a pull down transistor coupled between the first one of the bit lines and a first supply voltage, wherein the pull down transistor is a P channel FET.

14. The DRAM of claim 13, wherein the means for pre-charging is further adapted to, in the pre-charge state, pre-charge at least a second one of the bit lines to a second predetermined voltage biased toward a second weaker logic state, wherein the second weaker logic state is a logic high state, and wherein the means for pre-charging comprises a pull up transistor coupled between the second one of the bit lines and a second supply voltage.

15. The DRAM of claim 13, wherein the plurality of combinatorial logic circuits comprises a decoder circuit for indicating one or more of the memory cells, and wherein the pull down transistor comprises a control input coupled to the decoder circuit, and being connected between one of the indicated memory cells and one of the plurality of bit lines.

16. The DRAM of claim 13, wherein the predetermined voltage is substantially equal to $V_{SS}$.

17. The DRAM of claim 13, further comprising a sense circuit that is coupled to the plurality of bit lines and outputs a signal that indicates the logic state of the memory cell being read.

18. The DRAM of claim 13, wherein the sense circuit comprises CMOS logic.

19. The DRAM of claim 13, wherein the memory space is arranged as a matrix of rows and columns.

20. The DRAM of claim 13, wherein the memory space comprises reference cells.

21. A method for use in a CMOS DRAM having a memory space having a plurality of memory cells, at least a subset of the memory cells being capable of storing signals corresponding to a first logic state or a second logic state, wherein one of the logic states is weaker than the other logic state, and further having a plurality of bit lines for reading and writing data to the at least a subset of the memory cells, the CMOS DRAM including a read mode having a pre-charge state, the method comprising:
pre-charging at least a first one of the bit lines to a predetermined voltage biased toward the weaker logic state in the pre-charge state, wherein the weaker logic state is a low logic state, and wherein pre-charging the at least a first one of the bit lines comprises turning on a pull down transistor coupled between the first one of the bit lines and a first supply voltage, wherein the pull down transistor is a P channel FET.

22. The method of claim 21, further comprising pre-charging at least a second one of the bit lines to a second predetermined voltage biased toward a second weaker logic state in the pre-charge state, wherein the second weaker logic state is a logic high state, and wherein pre-charging the at least a second one of the bit lines comprises turning on a pull up transistor coupled between the second one of the bit lines and a second supply voltage, the first supply voltage having a higher potential than the second supply voltage.

23. The method of claim 21, wherein if the predetermined voltage is substantially equal to $V_{SS}$.

24. The method of claim 21, further comprising sensing a signal on the first one of the bit lines and providing a signal that indicates the logic state of the memory cell being read.

25. The method of claim 21, wherein sensing comprises supplying the first one of the bit lines to at least one CMOS logic circuit.

26. The method of claim 21, wherein the memory space is arranged as a matrix of rows and columns.

27. The method of claim 21, wherein the memory space comprises reference cells.

* * * * *